United States Patent [19]
Gist

[11] Patent Number: 5,361,042
[45] Date of Patent: Nov. 1, 1994

[54] COMPENSATED OFFSET VOLTAGE, LOW GAIN, HIGH BANDWIDTH, FULL SWING, WIDE COMMON MODE RANGE, CMOS DIFFERENTIAL VOLTAGE AMPLIFIER

[75] Inventor: William B. Gist, Chelmsford, Mass.

[73] Assignee: Digital Equipment Corporation, Maynard, Mass.

[21] Appl. No.: 79,723

[22] Filed: Jun. 18, 1993

[51] Int. Cl.⁵ .......................... H03F 1/26; H03F 3/45; H03H 11/28

[52] U.S. Cl. .................................. 330/261; 330/261; 330/258; 330/9; 330/290; 327/307

[58] Field of Search .................. 330/261, 258, 9, 290; 328/135, 141

[56] References Cited

U.S. PATENT DOCUMENTS

| | | | |
|---|---|---|---|
| 3,988,689 | 10/1976 | Ochi et al. | 330/9 |
| 4,920,339 | 4/1990 | Friend et al. | 340/825 |
| 5,029,284 | 7/1991 | Feldbaumer et al. | 307/443 |
| 5,045,806 | 9/1991 | Yan | 330/9 |

*Primary Examiner*—William L. Sikes
*Assistant Examiner*—Fetsum Abraham
*Attorney, Agent, or Firm*—Denis G. Maloney; Albert P. Cefalo

[57] ABSTRACT

An I/O bus interface cell includes a driver circuit having an input terminal fed by a logic signal and an output terminal to produce in response thereto a drive signal having selectable rise and fall time characteristics in accordance with a reference voltage provided to the driver. The I/O cell also includes a receiver circuit having an input terminal coupled to said output terminal of said driver with the receiver disposed to latch an unresolved, unamplified received signal prior to resolving the state of the signal. The I/O cell further includes a termination circuit having a terminal connected to the output of said driver, and having a selectable impedance characteristic at said terminal, with said selectable impedance being in accordance with a reference voltage provided to an input of said termination circuit. Preferably, the I/O cell the driver, receiver and termination circuits are fabricated on a common semiconductor substrate.

10 Claims, 23 Drawing Sheets

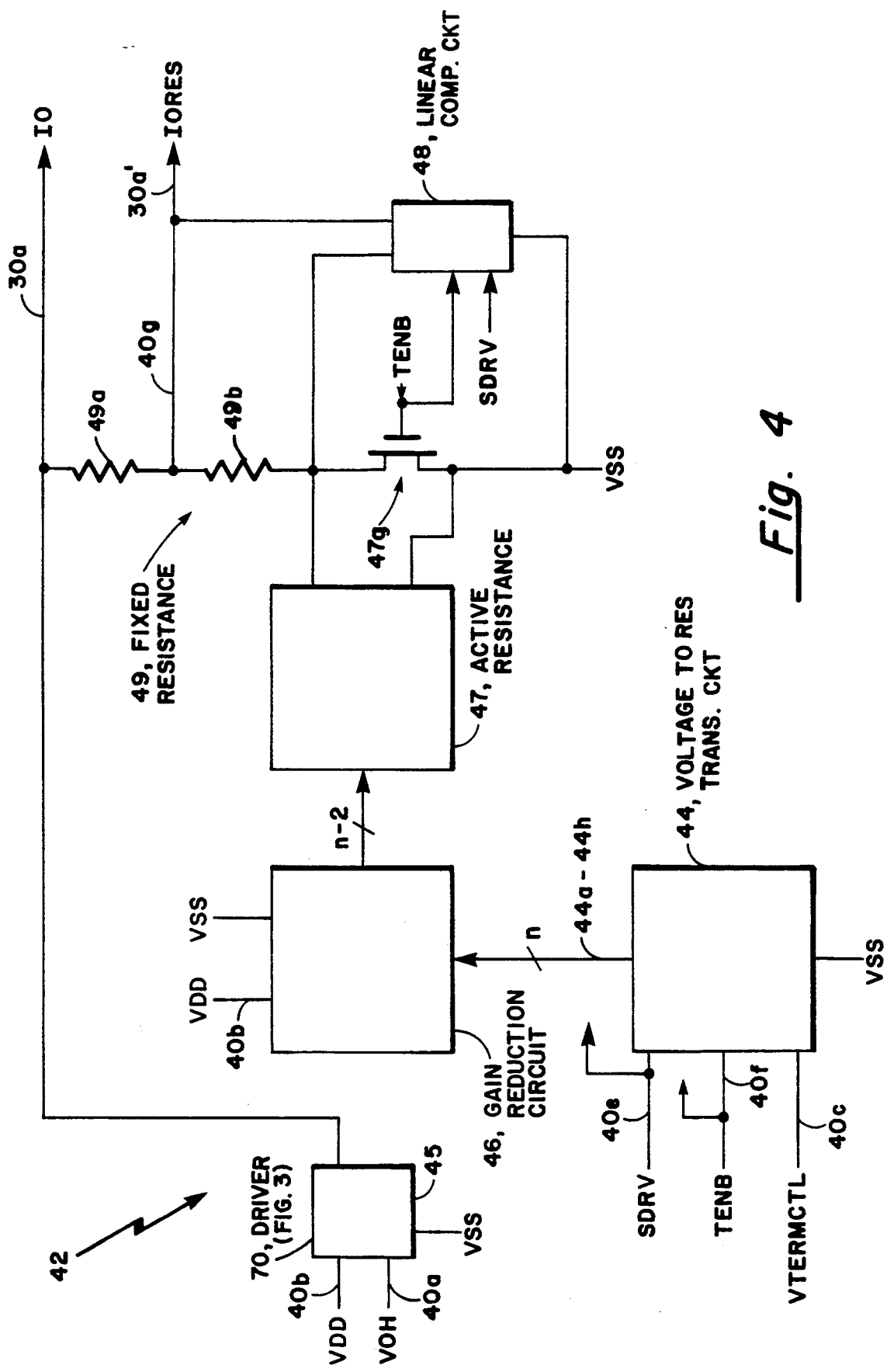

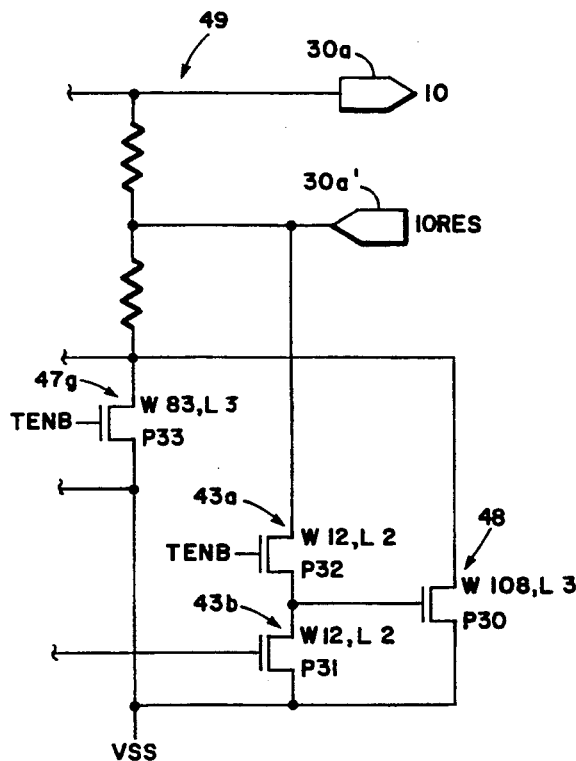
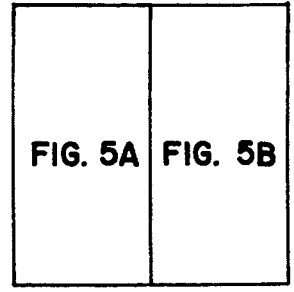
FIG. 5
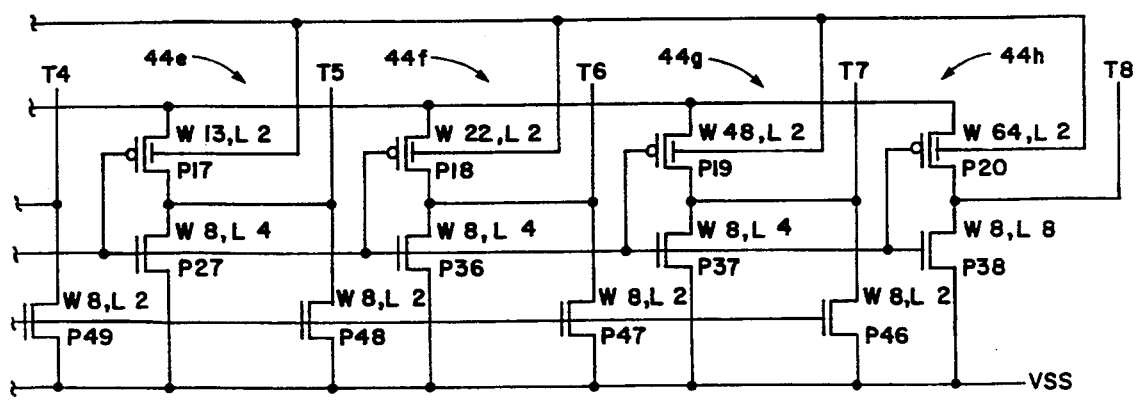
Fig. 5B

COMPENSATED OFFSET VOLTAGE, LOW GAIN, HIGH BANDWIDTH, FULL SWING, WIDE COMMON MODE RANGE, CMOS DIFFERENTIAL VOLTAGE AMPLIFIER

BACKGROUND OF THE INVENTION

This invention relates generally to amplifiers and more particularity to operational amplifiers.

As it is known in the art, a operational amplifier is commonly used to provide an amplified difference output voltage provided in response to a difference voltage between two input signals. Generally the operational amplifier is configured to receive two input signals at respectively its inverting and non-inverting inputs to produce in response the amplified difference output voltage.

Several characteristics of an ideal operational amplifier are that the amplifier has a very high voltage gain, a low output impedance, high input impedance, and high bandwidth. The exact specifications for each of these parameters will vary for real devices, but in general for any real device the specification of any of them can be generally characterized as mentioned above.

As is also known, operational amplifiers also have a characteristic called D.C. offset voltage. The D.C. offset voltage of an operational amplifier can be viewed as that voltage difference required at the inputs of the amplifier to provide a zero output voltage relative to a reference voltage. For ideal amplifiers the D.C. offset voltage is zero whereas for actual amplifiers it is generally several millivolts or more. This D.C. offset voltage is thus an error type voltage and in general is undesirable.

Techniques are known to compensate for this D.C. offset voltage. One technique involves the use of trimming an electrical characteristic of a component such as a resistor to reduce the D.C. offset. This technique while feasible with hybrid circuits is generally not feasible with monolithic integrated circuits. Another technique is to cascade several amplifiers together to reduce offset. This technique has several drawbacks including high cost and reduced bandwidth. In an operational amplifier, the design thereof can be modified to provide a higher voltage gain to swamp out the effects of the D.C. offset voltage. The chief problem is that the bandwidth of the amplifier is reduced and moreover such a circuit is potentially unstable and thus measures must be taken to make it stable.

SUMMARY OF THE INVENTION

In accordance with the present invention, a compensated operational amplifier, includes means for amplifying a differential input signal to provide an amplified output signal, means for replicating an offset voltage characteristic of the first means for amplifing and means for producing in response to an output from said amplifiying means and from said replicating means, a compensation output signal corresponding to the difference in voltage between the output of the replicating means and the output of the amplifying means. The amplifier further includes means, disposed in each of said means for replicating and means for amplifying, for changing a bias operation point of each of said means in response to said compensation signal to provide said signal from said replicating means equal to said signal from said amplifying means. With such an arrangement a compensated amplifier having a low offset voltage is provided. Since the amplifier includes means for replicating the signal from the amplifier means, offset voltage is substantially reduced without a concomitant reduction in bandwidth.

In accordance with a further aspect of the present invention, an amplifier includes means for providing a differential input stage, means for producing a pair of mirror current signals in response to a pair of input signals fed to said means for providing a differential input stage and means, responsive to a control signal, for changing a bias level of said means for providing a differential input stage. With such an arrangement, the means for producing a pair of mirror currents provides the output signals from the amplifier and the control signal is used to change the operating point of the input stage and hence the mirror currents. This permits the amplifier to be adjusted to compensate for errors such as offset voltage in the differential input stage.

BRIEF DESCRIPTION OF THE DRAWINGS

The above-mentioned and other features of the invention will now become more apparent by reference to the following description taken in connection with the accompanying drawings in which:

FIG. 4 is a block diagram of a termination circuit used in the integrated bus I/O cell of FIG. 3;

FIG. 5 is a diagram showing the relationship between FIGS. 5A and 5B;

FIGS. 5A and 5B are schematic diagrams of an embodiment of the termination circuit of FIG. 4;

FIG. 9 is a diagram showing the relationship between FIGS. 9A and 9B;

DESCRIPTION OF THE PREFERRED EMBODIMENTS

Figure 1:
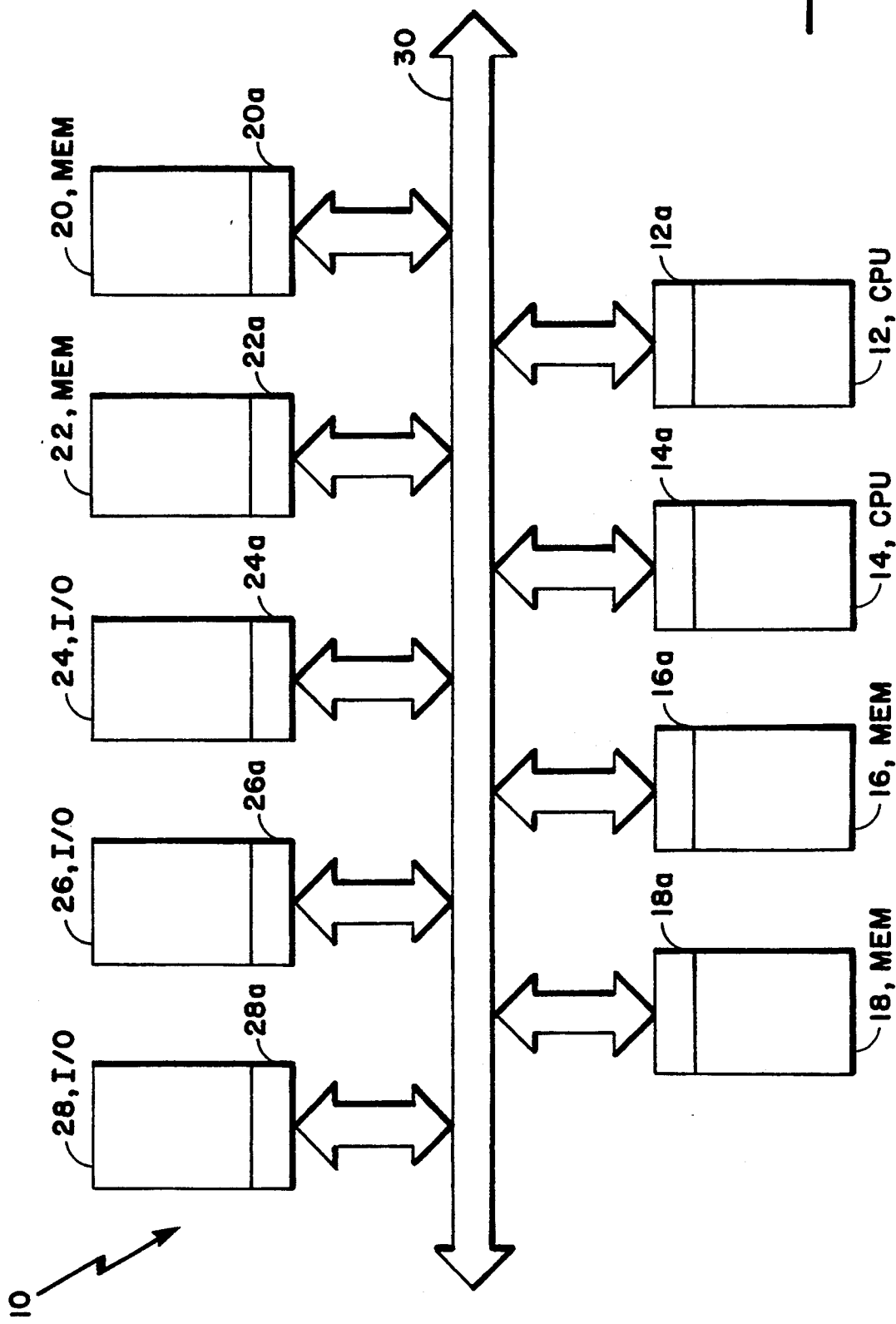
FIG. 1 is a block diagram of a computer system including a system bus.

Referring now to FIG. 1, a computer system 10 is shown to include a pair of central processing units (CPU's) 12, 14 each CPU including an interface circuit 12a, 14a respectively. The computer system 10 is shown to further include here four memory modules 16, 18, 20 and 22 each also having interface circuits 16a through 22a respectively and three I/O modules 24, 26, and 28 with each having respective interface circuits 24a, 26a and 28a, as shown. Each of the interfaces 12a through 28a are interconnected together via a system bus 30. System bus 30 includes address, control and data lines as necessary. The interfaces for each of the devices 12 to 28 include logic circuits (not shown) to provide proper logic processing functions of logic signals provided via the bus 30, as appropriate according to a designated protocol implemented by the bus 30. These logic circuits (not shown) are coupled between circuits on the respective modules and bus interface circuits, as will be described.

Figure 2:
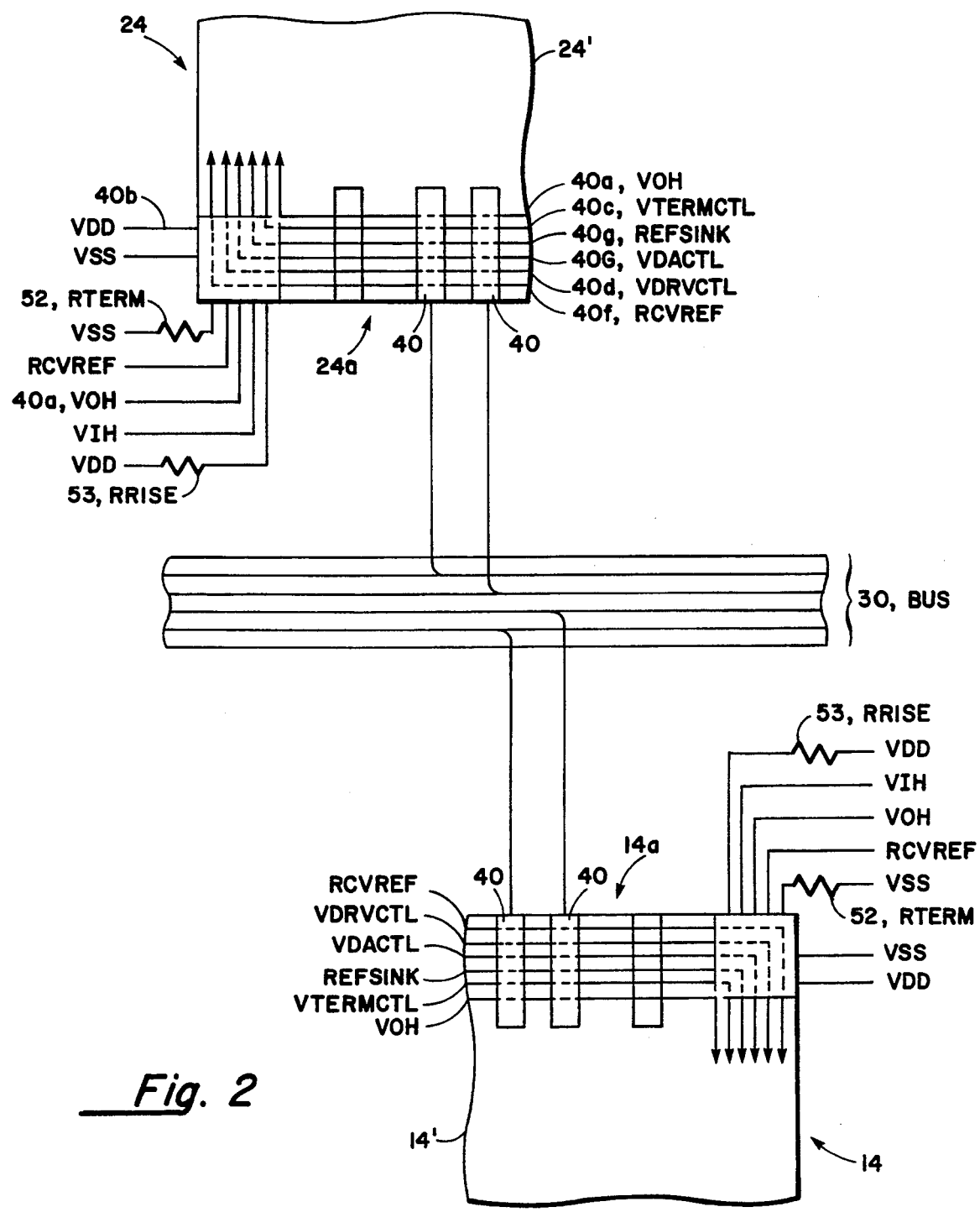
FIG. 2 is a diagrammatical representational view of a layout of portions of integrated circuit used in the computer system of FIG. 1, showing bus interface circuit portions of the integrated circuits coupled to the system bus of the computer system of FIG. 1.

Referring now to FIG. 2, a representative portion of the system 10 is shown. Here modules 14 and 24 (FIG. 1) are shown diagrammatically as integrated circuits 14' and 24' each having a plurality of integrated bus I/O interface cells 40 disposed about the periphery of the integrated circuits. Details of the interface cells 40 will be discussed in conjunction with FIGS. 3 to 20.

Suffice it here to say that the devices 14 and 24 of FIG. 1 include an integrated circuit 14a' and 24a' here an ASIC (application specific integrated circuit) which is part of the interface circuit 14a and 24a to the particular device 14, 24 (FIG. 1). Each I/O cell 40 of each circuit for each device is interconnected via conductors of bus 30 which are typically disposed on a printed wiring board (PWB) such as a backplane or motherboard (not shown) to each corresponding line on the devices 12 to 28 (FIG. 1). Each of the bus interface cells are also interconnect via a interface cell control bus 41, 41' with each of said buses typically being unique for each one of said devices 12-28. Each of such buses include reference voltage signals, enable signals and supply voltage signals, as necessary for operation of integrated I/O cell circuits, as will now be described.

Figure 3:
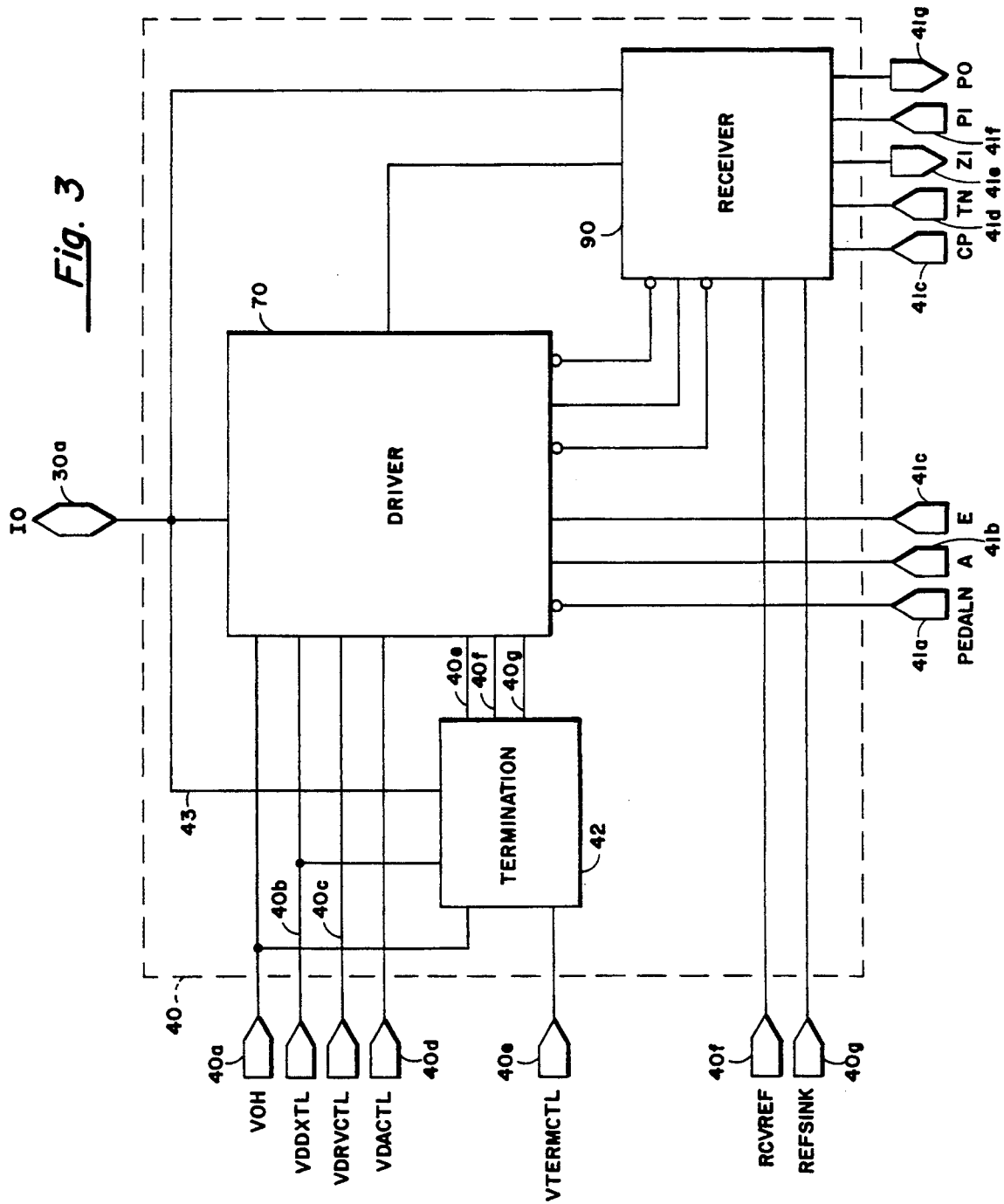
FIG. 3 is a block diagram of an integrated bus I/O cell including driver, receiver, and termination circuits to interface to the system bus shown in FIGS. 1 and 2.

Referring now to FIG. 3, an illustrative one of the bus interface cells 40 is shown to include a programmable internal termination resistance 42, a driver 70 and a receiver 90. The programmable internal termination circuit 42 has an output terminal "IO" which is connected to respective IO terminals on the driver 70 and the receiver 90 at a point proximate the latter two devices. Since the termination circuit 42 is preferably integrated on the same semiconductor circuit as the driver 70 and the receiver 90, the distance between the connections is extremely small.

The bus interface cell 40 is fed by a first plurality of lines 40a to 40g corresponding to voltage reference signals, control signals and voltage potentials which are common to all of the cells 40 on a given ASIC.

Signal "VOH" on line 40a is "voltage output high" and is used by the driver 70 and a positive clamp overshoot 86 circuit in the termination 42 to specify the maximum output high voltage for a logic "one" state. That is, this signal is a voltage reference corresponding to a limit of the driver high level voltage in an unloaded state. Signal "VDDXTL" on line 40b is the external supply voltage used by the termination circuit 42, the driver circuit 70, and receiver circuit 90 as the basic supply voltage for the circuits. In some implementations of the integrated IO cell it is preferable to have a separate supply connection for the receiver 90. Signal "VDRVCTL" on line 40c is "voltage driver control signal" and is used to determine the level of current driven by the driver. Signal "VDACTL" on line 40d is voltage reference for a differential amplifier in the driver 70 and is used by the driver 70 to control the differential amplifier current. In particular, signal VDACTL is used to control the rise and fall times of a signal driven from the driver device 70. Signal "VTERMCTL" is the voltage termination control signal and is fed on line 40e to the termination circuit 42. Signal VTERMCTL is used to represent the desired resistance characteristic to be provided by the termination circuit 42. This voltage signal is converted into a resistance within circuit 42 to provide in combination with a fixed resistance (not shown) in circuit 42 the desired resistance characteristic. Signal "RCVREF" on line 40f is the receiver reference level and is used by the receiver 60 to distinguish between a logic high level and a logic low level. Signal "REFSINK" on line 40g is the reference sink level and is used by the receiver 60 during precharging of a data resolution circuit in the receiver.

Signals VTERMCTL and VOH and VDDTL are used by the termination circuit 42 to provide a controlled, compensated termination resistance at the pad IO. This permits each line of bus 30 to be terminated in a characteristic impedance which minimizes reflections on the bus 30 and also minimizes reflections on lines between the system bus 30 and the driver/receiver circuits in each of the cells 40. Thus, the length of conductor between the driver, receiver circuits 70, 90 and the bus 30 is also properly terminated. Moreover, by providing a termination circuit 42 which provides a programmable impedance, here a resistance type, the circuit can compensate for variations in circuit parameters caused by differences in circuit processing, aging and temperature.

The signal VTERMCTL is derived from an externally settable resistance 52, RTERM which is used to calibrate the signal under changing conditions. Derivation of the signal VTERMCTL will be discussed in conjunction with FIG. 6 and 7.

Driver 70 here is a voltage mode controlled device. The driver 70 is used to drive a signal on to the bus 30. The driver 70 operates from a standard (non-reduced) supply voltage to provide I/O signals with reduced voltage swings. The driver 70 further provides the driven signal as a logic "1" (one) level. Thus the driver sources current when driving the bus to a logic "1" level. The termination 42 is used to pull the bus line down to VSS to provide the logic "0" state. The driver further provides signals having controlled rise and fall times to further increase bus speed. The rise and fall times are controlled via an single external resistance 53 (RRISE) for each module. Details of the circuits used to provide external control of the rise and fall times of the driver 70 will be discussed in conjunction with FIG. 9C. The driver 70 includes a speed increase circuit to anticipates the next state of the bus. Thus, the speed increase circuit preconditions the bus to increase bus speed.

Receiver 60 here is a precision receiver which latches an unamplified, unresolved state of a signal at an input thereof.

Referring now to FIG. 4, the termination circuit 42 is shown to include a voltage to resistance translation circuit 44 which is fed by signals VTERMCTL, TENB, and SDRV, as shown and as described in conjunction with FIG. 3. The termination circuit 40 also includes a gain reduction circuit 46 and an active resistance circuit 47. The active resistance circuit includes a transistor 47g coupled in series with a fixed, passive resistance 49 and coupled in shunt with the remainder of the active resistance circuit 47. The transistor 47g coupled in series with the fixed passive resistance network 49 provides a resistance characteristic which is variable between the value of the fixed passive resistance and maximum resistance of the transistor 47g, and the minimum resistance provided by the combination of the fixed passive resistance and the resistance provided by transistor 47g and the resistance of active resistance circuit 47 in accordance with control signals provided from voltage to resistance translation circuit 44.

A linearizing circuit 48 is disposed in parallel about the transistor 47g to improve the linearity of the transistor 47g and active resistance circuit 47.

Voltage to resistance translation circuit 44 converts the signal VTERMCTL to a series of output signals on lines 44a–44h. These signals on lines 44a–44h are here representative of threshold voltage levels which when applied to active resistance circuit 47 will produce in response, selectable levels of resistance at the output of the circuit 47. The selectable levels of resistance in parallel with the transistor 47g provide a selectable resistance characteristic in series with the fixed passive resistance 49.

These signals are preferably fed to a gain reduction circuit 46. Gain reduction circuit 46 provides a resistance connecting each of the adjacent control signals. Since the voltage to resistance translation circuit 44 provides an output voltage which does not vary linearly with applied input voltage as provided from the signal VTERMCTL, the gain reduction circuit 46 introduces a device based resistance into the path between the voltage to resistance translation circuit and the active resistance circuit. This makes the relationship between VTERMCTL and output resistance from the active resistance more linear.

The output of the translation circuit 44 or the optional gain reduction circuit 46 is fed to the active resistance 47 to provide in combination with the fixed resistance 49, a selectable resistance characteristic at the output of the termination circuit 40 at terminal 30a (IO), as mentioned. Here, fixed passive resistance 49 is comprised of a first resistance 49a and a second resistance 49b. The second resistance is disposed between terminal IO and a terminal IORES as shown.

Figure 5A:
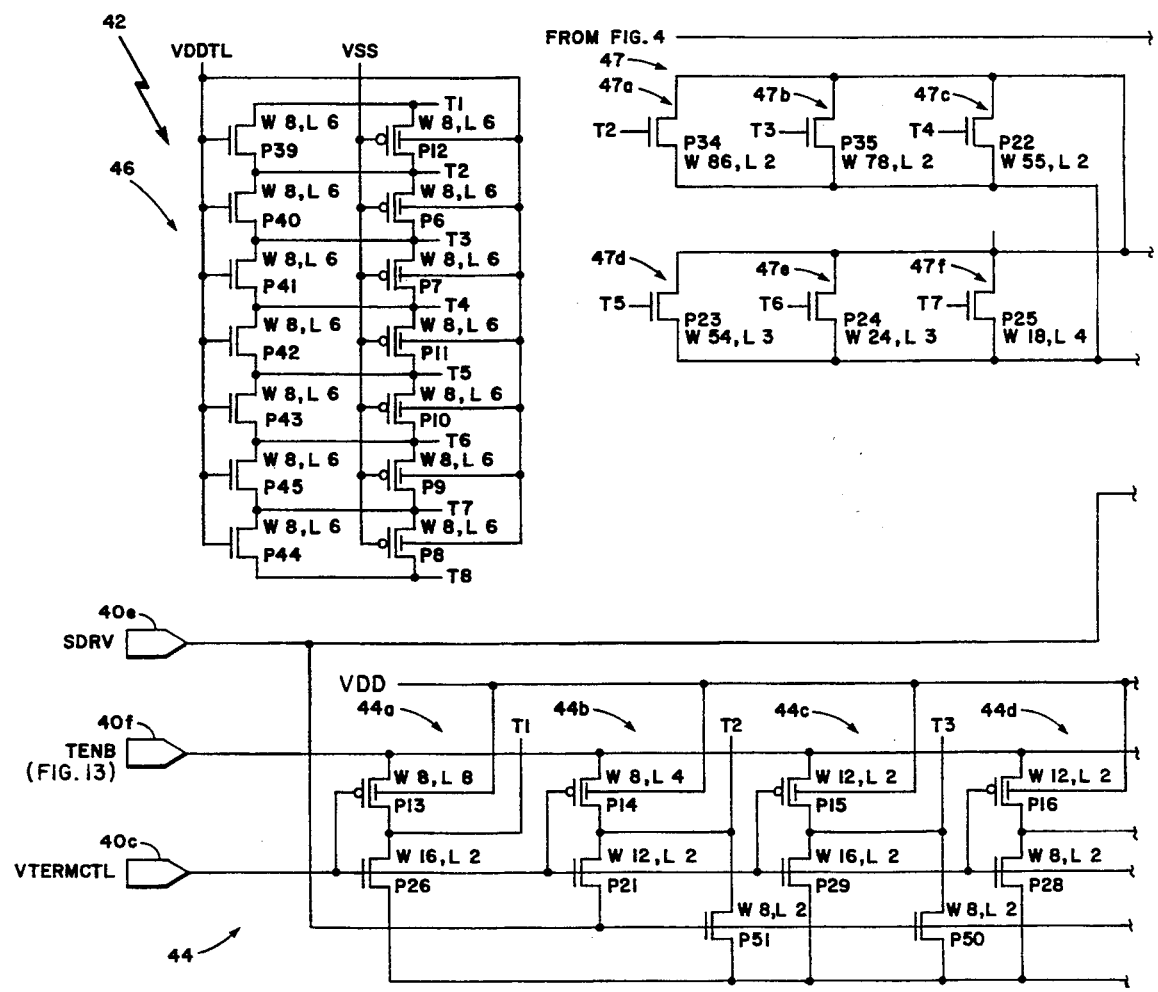

Referring now to FIGS. 5A and 5B an exemplary one of the termination circuits 42 is shown to include the voltage to resistance translation circuit 44 which includes a plurality of successively coupled stages of circuits here inverters 44a to 44h. Each inverter includes a pair of transistors here complementary metal oxide semiconductor (CMOS) transistors. That is, each inverter 44a to 44h includes an NMOS device and a PMOS device with NMOS devices denoted by a direct line between a gate and drain-source junction and each PMOS device denoted by an open circle in the gate. Further each of said transistors have an indicated size, with W corresponding to a width of the device and L corresponding to a length of the device. Further the size is expressed in Complementary Device Units where one unit corresponds to 0.375 microns. Each of the transistors includes a control electrode or gate electrode and a pair of output electrodes or source and drain electrodes. Each of the gate electrodes is connected to the line carrying signal VTERMCTL; whereas the source electrodes of the NMOS devices are here connected to a reference potential "VSS" and the drain electrodes of the NMOS devices are connected to control signal terminals T1 to T8 respectively as shown. The drain electrodes are also connected to the drain electrodes of a corresponding one of the PMOS transistors as shown. The source electrodes of the PMOS devices are connected to line 40f carrying signal TENB. The transistors of the inverters also have a connection to the substrate or bulk material of the PMOS devices due to process considerations of PMOS devices. This connection (not shown) is made to VSS the supply voltage for NMOS devices.

Signal TENB is provided from a state device in the driver 70 as will be described. TENB is used to switch off the termination when the line associated with the termination is being driven. Thus, for the above arrangement since the termination is coupled to VSS or as here ground potential, the driver drives current onto a corresponding line when the state of the signal is a logic one. Thus, TENB is used to turn off the termination such that the driver 70 (FIG. 3) does not drive current into its own termination resistance provided by termination circuit 42 when that driver is placing a logic one onto the output line IO.

Signal TENB is provided from the receiver (FIG. 13), as will be described. When TENB is in a high state and SDRV is low, this state indicates that the driver is not driving the line IO and the sources of transistors P13 to P20 are at a high voltage level and thus the converter is on. When TENB is low and SDRV is high this indicates that the driver is driving the line IO and thus turning the termination off. This arrangement saves power while driving since the driving cell 40 does not drive current into its own termination. Further this also reduces power dissipation in the driver circuit which is driving the bus line and concomitant therewith reduces dissipated heat.

Each of the inverters 44a to 44h is thus successively connected between TENB and VSS. The inverters 44a to 44h each have selected sizes to provide concomitant values of threshold voltage to turn on the NMOS transistors 47a–47f at different voltage levels. The selected values of threshold voltage are provided by scaling the ratios of the sizes of the PMOS transistor to the size of the corresponding NMOS transistor (expressed in CMOS drawn units or CDU's). A CDU is the equivalent of 0.375 microns. Here the inverters are arranged in successively increasing threshold characteristics or successively increasing ratio characteristics. An illustrative example of values of ratios is set forth in Table I below.

TABLE I

| INVERTER STAGE | PMOS in CDU's W | PMOS in CDU's L | NMOS in CDU's W | NMOS in CDU's L | P (W/L)/N (W/L) |
|---|---|---|---|---|---|
| 44a | 8 | 8 | 16 | 2 | 1/8 |
| 44b | 8 | 4 | 12 | 2 | 1/3 |
| 44c | 12 | 2 | 16 | 2 | 3/4 |
| 44d | 12 | 2 | 8 | 2 | 1.5 |
| 44e | 13 | 2 | 8 | 4 | 3.25 |
| 44f | 22 | 2 | 8 | 4 | 5.5 |
| 44g | 48 | 2 | 8 | 4 | 12 |
| 44h | 64 | 2 | 8 | 8 | 32 |

The voltage to resistance translator 44 further includes a third plurality of here NMOS transistors coupled in shunt with the second and succeeding ones of said first plurality of NMOS transistors. Since the second plurality of NMOS transistors are relatively small in size or have a relative low gate drive, the third plurality of 44 transistors are used aid the corresponding NMOS transistors of the inverters 44b to 44h to turn off or pull lines T1 to T8 to VSS.

In operation circuit 44, a voltage signal VTERMCTL on line 40c is fed to the gate electrodes of each of the transistors in the circuit 44. In accordance with the value of the signal VTERMCTL, possibly the first stage and here consecutive succeeding ones of the stages will turn "on" or conduct with the NMOS, PMOS transistors of the respective stage providing a voltage at the output of the respective stage and thus on respective lines T1 to T8. Succeeding ones of the inverters will have the PMOS transistors turn on until the value of the VTERMCTL voltage is less than the threshold voltage of the inverter causing the PMOS device to turn on and place a logic one on the succeeding output lines through T8. In this manner a voltage level representative of a desired resistance value is translated into a series voltage level control signals.

These voltage level control signals are fed to the gain reduction circuit 46. The gain reduction circuit 46 includes a second plurality of stages. Each of the stages includes a pair of coupled PMOS and NMOS transistors with corresponding gate electrodes coupled to VSS or VDD respectively. The gain reduction circuit is fed by signals T1 to T8 as shown. A signal on line T2 is fed to the first pair of transistors which being in a resistive mode adds a transistor based resistance into the path provided from the voltage to resistance translation circuit 44 to the active resistance circuit 47. This arrangement is used to flatten out the response of the first stage of the voltage to resistance translation circuit 44 reducing the gain from the stage and causing a change in resistance between successive lines to be smaller.

The second and succeeding signals except the last signal are also coupled to the active resistance circuit 47. Active resistance circuit 47 includes a plurality of transistors here each being NMOS type and each having selected sizes. A illustrative example of sizes is given in Table II.

TABLE II

| DEVICE | WIDTH (CDU) | LENGTH (CDU) | RATIO W/L |
|---|---|---|---|
| 47a | 86 | 2 | 43 |
| 47b | 78 | 2 | 36 |
| 47c | 55 | 2 | 27.5 |
| 47d | 54 | 3 | 18 |
| 47e | 24 | 3 | 8 |
| 47f | 18 | 4 | 4.5 |

The control signals T2 to T7 are fed to the control electrodes (gates) of each of the transistors 47a–47f respectively. The respective drains and sources of the transistors 47a to 47f are coupled together, as shown to provide a network of parallel connected devices. The active resistance 47 further includes an NMOS transistor 47g which is coupled in parallel with the remaining transistors 47a to 47f as shown.

The gate of transistor 47g is fed signal TENB. Here transistor 47g is selected to have a size such that when TENB is asserted "high" transistor 47g provides the termination circuit 42 with a maximum active resistance of here 83 ohms. This maximum resistance in combination with the resistance of the fixed resistance 49 provides an overall maximum resistance of about 180 ohms here used at extreme variations caused by semiconductor processing, supply voltage and operating temperature. Successive ones of the remaining transistors are coupled in parallel with the transistor 47g to selectively reduce the resistance across the nodes to which transistor 47g is connected to a selected value in accordance with the state of the control signals derived from the reference voltage signal VTERMCTL. Transistor 47g is also coupled to fixed resistance network 49 and VSS. Fixed resistance 49 provides a fixed passive resistance of about here 97 ohms although other values could be used.

The combination of fixed resistance 49 and active resistance 47 provides the termination with a resistance which can vary between a minimum as determined by the minimum resistance of network 47 here 29 ohms and fixed resistance 49 here 97 ohms and a maximum as determined by the maximum resistance of network 47 here 83 ohms and fixed resistance 49 here 131 ohms.

A termination switching circuit 43 is also disposed around transistor 47g. Circuit 43 includes two transistors 43a and 43b. Transistor 43a has its gate electrode coupled to TENB whereas transistor 43b has its gate electrode coupled to signal SDRV. Transistor 43a controlled by signal TENB and transistor 43b controlled by signal SDRV both act as switches. As mentioned above, signal TENB is also fed to transistor 47g. When TENB is asserted high and SDRV is low the active and fixed resistances are connected to the output of the circuit. This permits the termination to terminate the signal provided to the particular I/O cell.

When SDRV is high and TENB is low, the termination is removed from the circuit which is driving its corresponding I/O line 30a to a logic "1" level. This reduces power dissipation and hence heat in those I/O cells which are driving the bus 30.

The transistors 43a and 43b have source and drain electrodes respectively tied together and coupled to a gate electrode of a transistor 48. Thus, the state of these transistors is used to control the gate of transistor 48. The transistor 48 has its gate driven essentially from the output signal at terminal IORES i.e. through transistor 43a. The drain of transistor 48 however is connected to the connection of the active and passive resistance networks that is at a voltage divider. Thus the operating characteristics of transistor 48 are different than those of transistor 47g and transistors 47a to 47f in active resistance network 47. This permits the transistor to compensate for the non-linear characteristics of the active resistance network 47.

Transistor 48 has a resistance versus voltage characteristic which is opposite to that of the transistors in the active resistance network 47. Thus, when transistor 48 is enabled, it provides a non-linear resistance characteristic which tends to be opposite to and thus compensates for the non-linear resistance characteristic of the active resistance network 47. This arrangement presents a more linear resistance characteristic to a signal fed to the terminal IO. The linearity characteristic of transistors 47 is such that as voltage at signal IO is increased, resistance of transistor 47a to 47g increase. Opposing this the linearity characteristic of transistor 48 is such that as voltage at signal IO increases the resistance of the transistor 48 decreases. Transistors 47a–47g and 48 are coupled at source and drain terminals to provide in combination a characteristic resistance which is more linear vs. applied voltage.

Figure 6:
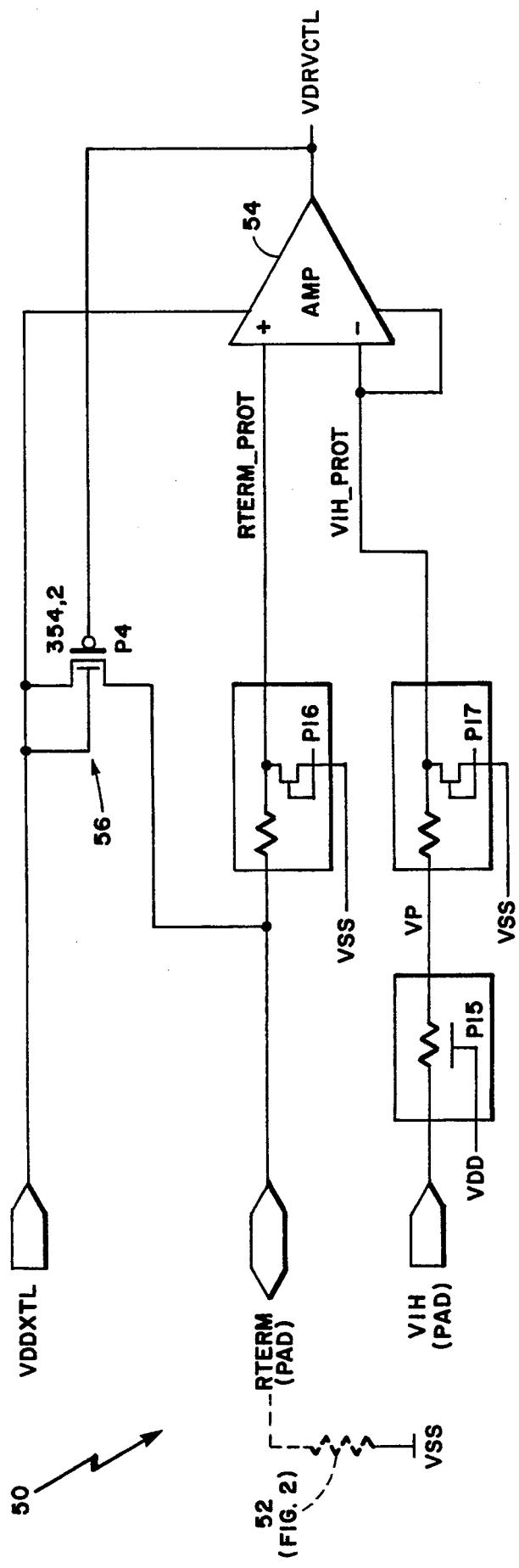
FIG. 6 is a block diagram of a control circuit used to provide a reference voltage for the termination circuit and driver circuit of FIG. 3.

Referring now to FIG. 6, a control circuit 50 to control the setting of the reference voltage VTERMCTL is shown to include a preferably high precision, highly stable resistance 52 connected external to the control circuit 50 and to its associated ASIC 12a–28a (FIG. 1). The resistance 52 has a terminal coupled to a non-inverting input of an operational amplifier 54 here a compensated amplifier having a low offset voltage and a remaining terminal coupled to VSS. The inverting input of the amplifier 54 is coupled to a terminal which is fed by a voltage VIH a precise and stable reference voltage. Voltage VIH is the reference voltage corresponding to a representative high input voltage level. The circuit 50 is shown to further include a transistor 56 having a gate electrode coupled to the output of the amplifier 54 and a source electrode coupled to VDDXTL the external supply voltage source. The transistor 56 is shown to further include a drain electrode coupled to the external resistance 52, as shown.

The above arrangement is used to drive the output of the amplifier 54 to a voltage "VDRVCTL" which corresponds to that voltage required to insure that the voltage at the two inputs of the amplifier 54 are equal. Thus, given a reference voltage VIH, the amplifier output via the connection to the gate electrode of transistor 56, drives the transistor 56 to a voltage at the drain across external resistance RTERM that equals VIH. As process, aging, and operating conditions vary, the voltage on the output of the amplifier also varies to provide VDRVCTL tracking all sources of variation.

Figure 9A:
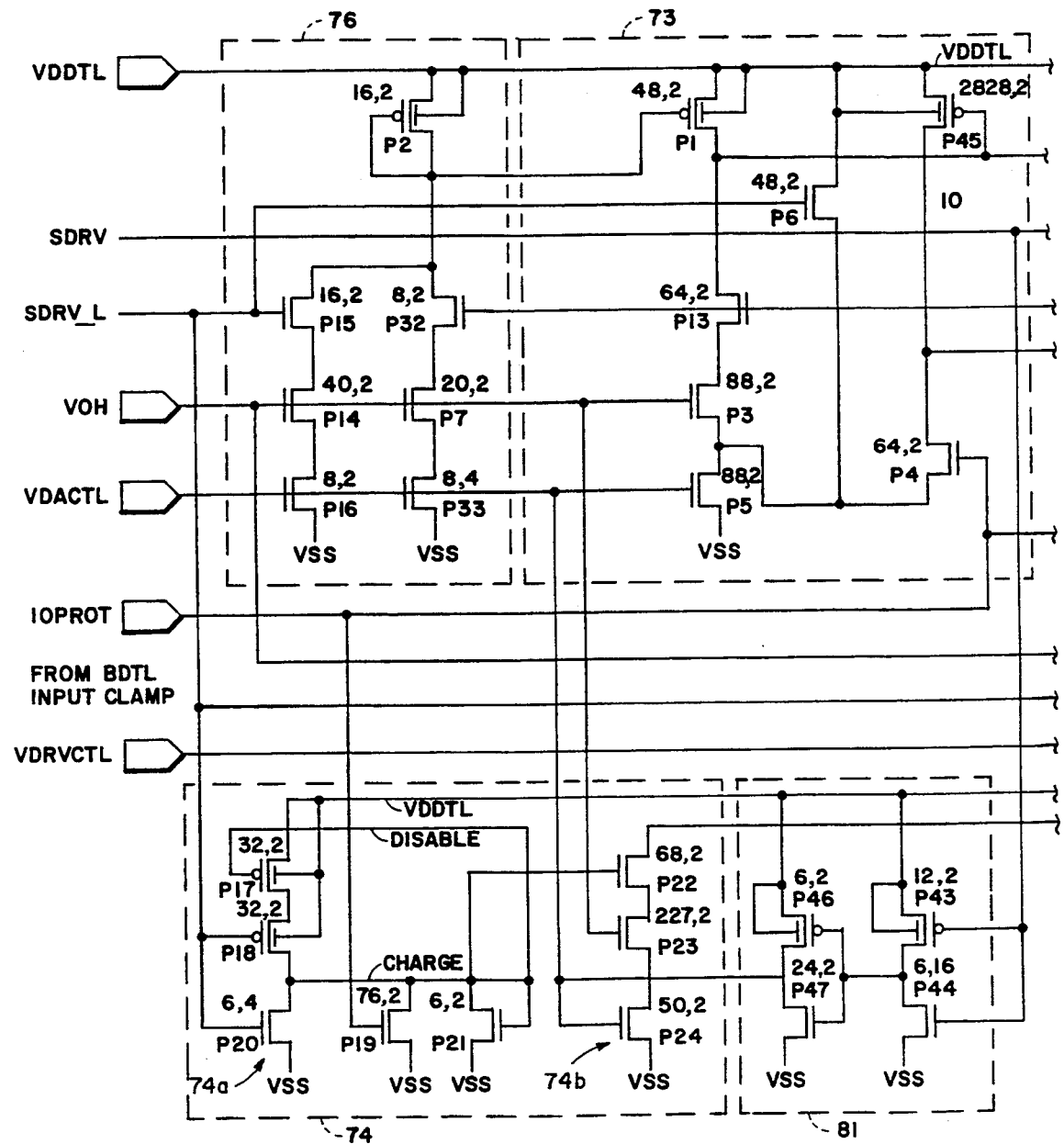
FIGS. 9A and 9B are schematic diagrams of an embodiment of the driver of FIG. 8.
Figure 9B:
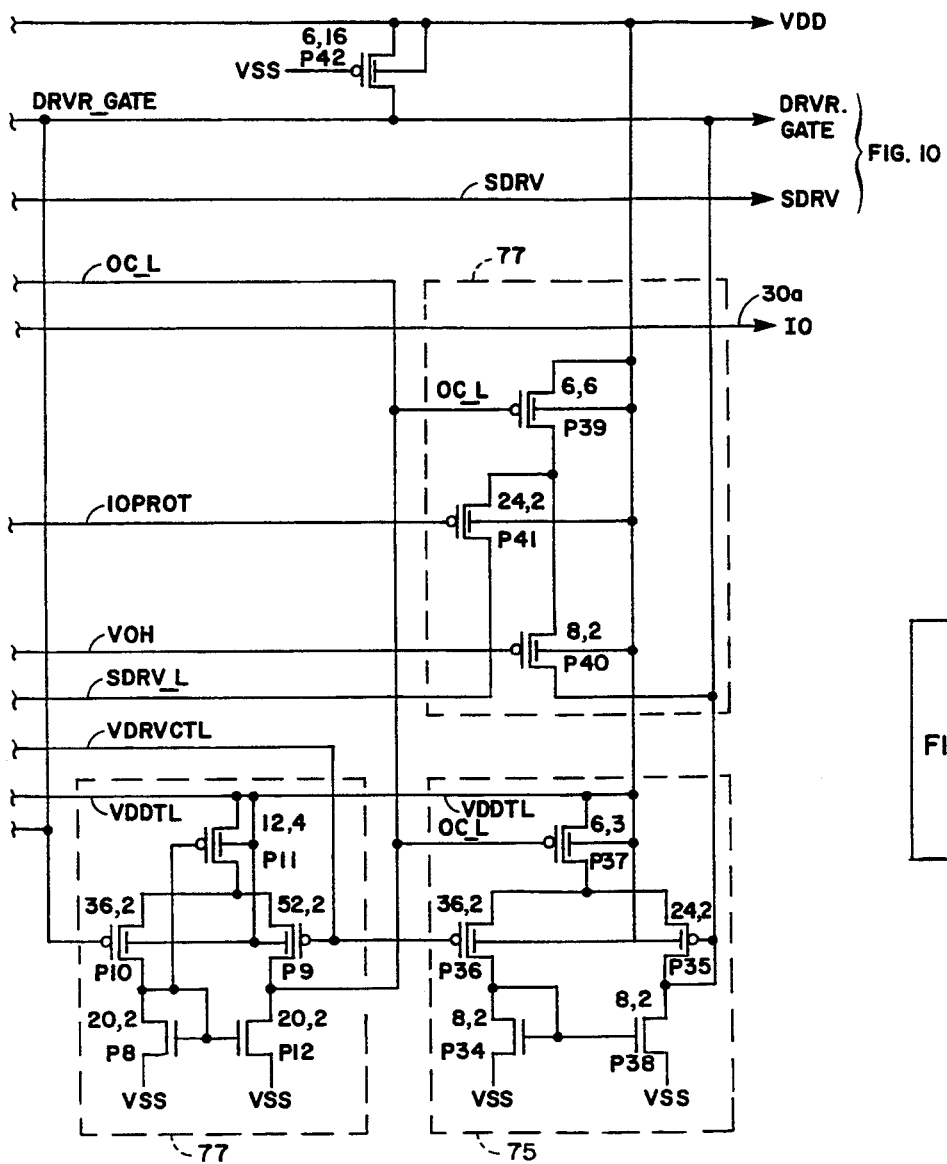
Figure 9C:
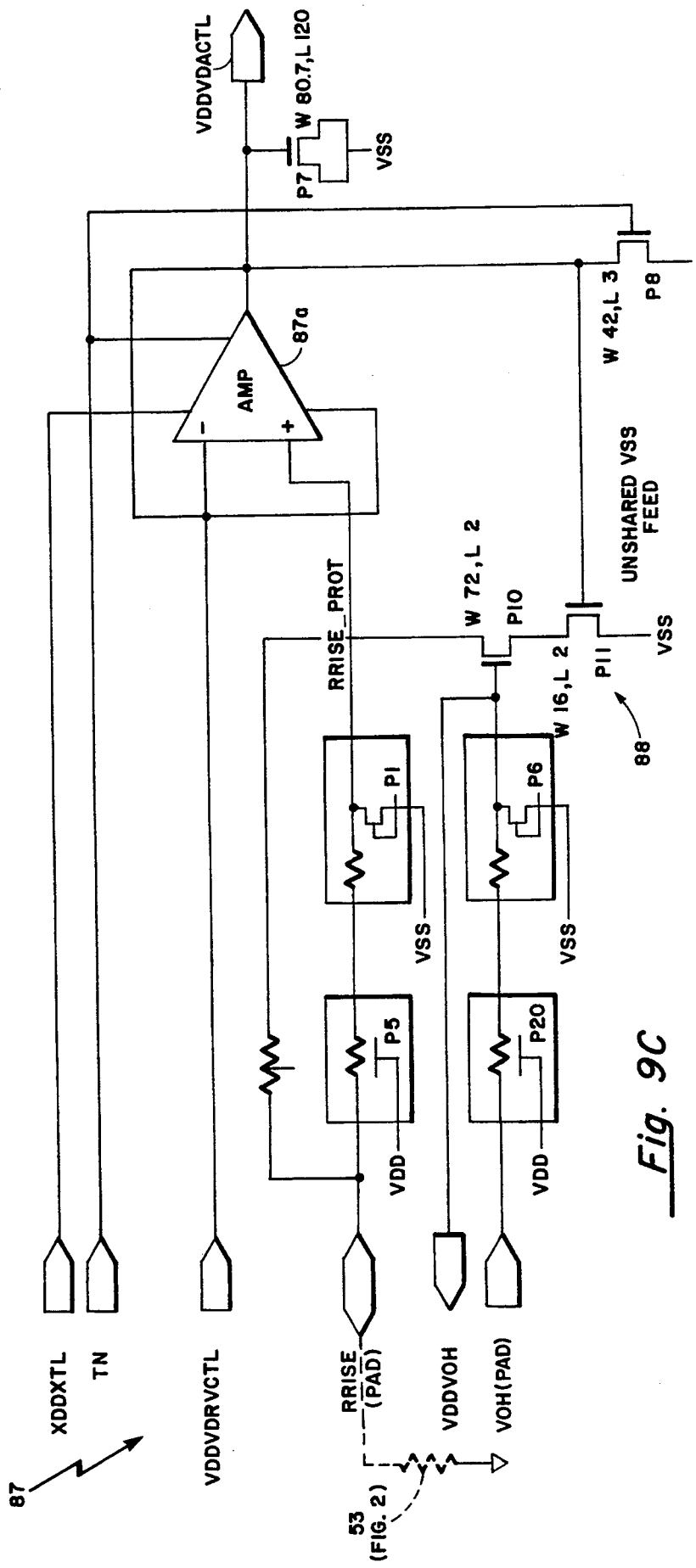
FIG. 9C is a block diagram of a control circuit used to provide a signal to control current from the driver of FIGS. 9A and 9B.

Voltage VDRVCTL is used to control the operating current of speed increase circuit 82, driver 70 current limit, as well as to provide timing control for the circuit which provides VDACTL (FIG. 9C). The current controlled by VDRVCTL is unvarying for a fixed VIH voltage and RTERM resistance and is identical in all ASIC's. This controlled current is proportional to voltage VIH divided by resistance RTERM. The driver current limit is preferably eight (8) times the current flowing through RTERM, representative of a driving module supplying driver current to eight receiving and hence terminating modules each disposed at an RTERM terminating resistance.

Figure 7:
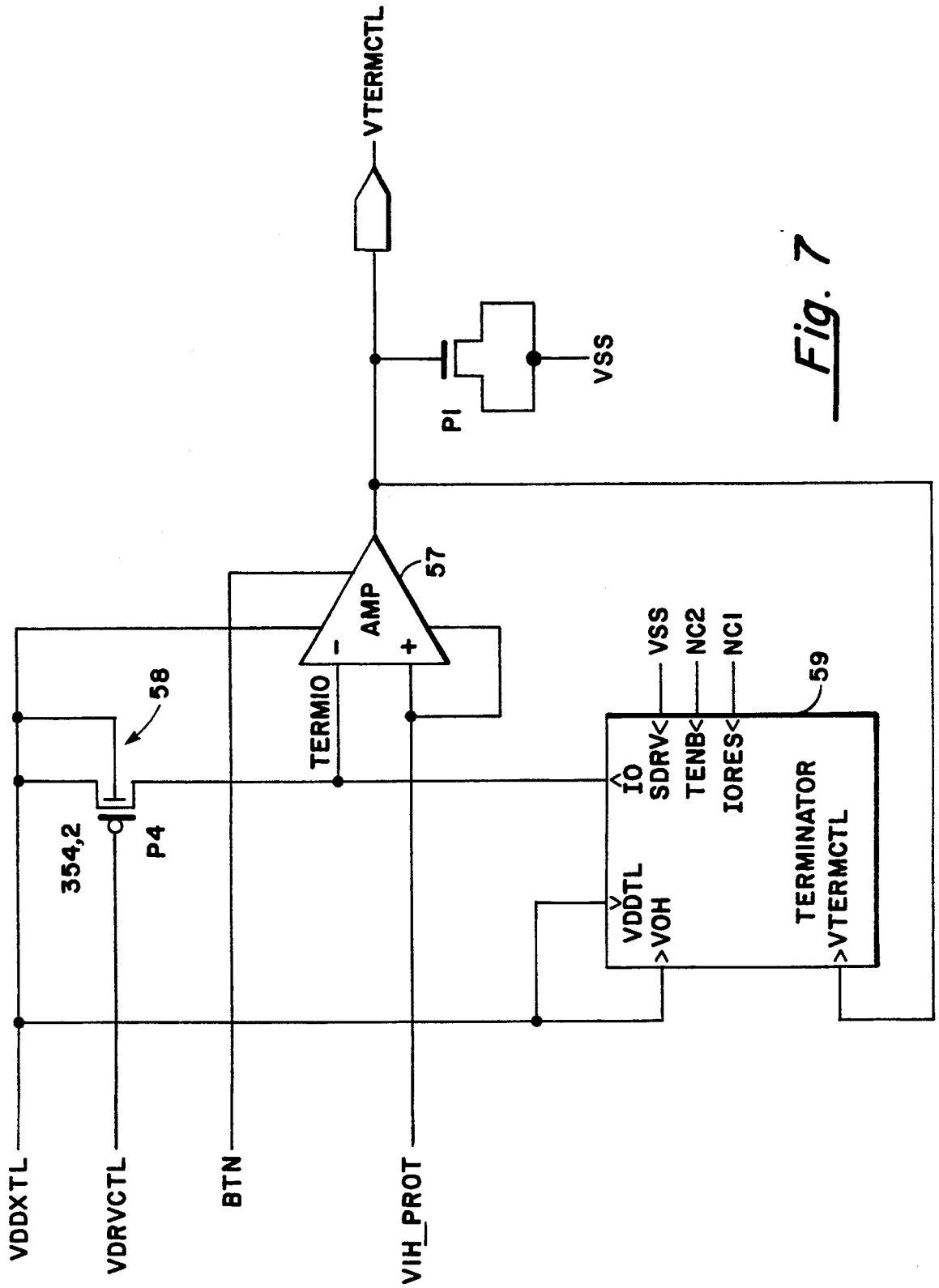
FIG. 7 is a block diagram of a termination reference voltage control circuit used to provide a reference voltage for the termination circuit of FIGS. 4 and 5.

Referring now to FIG. 7, the reference voltage VIH is also fed to a non-inverting input of a second operational amplifier 57 here also a compensated amplifier having a low offset voltage. An inverting input of the amplifier 57 is fed from a drain electrode of a transistor 58. Transistor 58 further has a gate electrode fed by the signal VDRVCTL from operational amplifier 54 (FIG. 6) and a source electrode connected to the external supply voltage VDDXTL. The output of the amplifier 57 is coupled to reference input terminal "VTERMCTL" of a termination circuit 59 which is disposed as part of the control circuit 50 of the bus interface for the device. Since the control circuit is preferably on the same integrated circuit as the I/O cells 40 for the interface for the circuit, the termination 59 in the control circuit will have substantially the same characteristics as the termination 42 in each of the I/O cells 40.

The signal VDRVCTL from amplifier 54 drives transistor 58 which is preferably the same size as and has the same characteristics as transistor 56 to produce a voltage on the inverting input to the amplifier 57. The amplifier 57 drives the line VTERMCTL through the termination 59 so that the value of the signal VTERMCTL corresponds to that necessary to set the resistance of the termination 59 in control circuit 50 to the same resistance as RTERM (FIGS. 2 and 6). The voltage reference VTERMCTL thus provides a calibrated signal which is used to set each termination 42 in each I/O cell 40 of a particular ASIC to substantially the same value of resistance.

Thus, with this arrangement, only a single resistance RTERM per ASIC is needed to provide a common reference voltage for the particular ASIC when setting termination resistance. The signal VTERMCTL is derived from a stable fixed resistance, precise reference voltage, and a representative termination circuit 59 which being on the same chip as the terminations 42 in each I/O cell provides the termination 59 and termination 42 with substantially the same electrical characteristic. Accordingly, this arrangement can be used to compensate for electrical variations caused by aging, temperature, supply voltage and process variations.

Therefore, the value of VTERMCTL is set with respect to a precise resistance which is provided external to the termination 42 and the voltage value of VTERMCTL is also calibrated against a representative one of the termination circuits 59 to insure that the voltage reference signal VTERMCTL reproduces a similar resistance on the output of each of the terminations 42 in the I/O cells 40.

Figure 8:
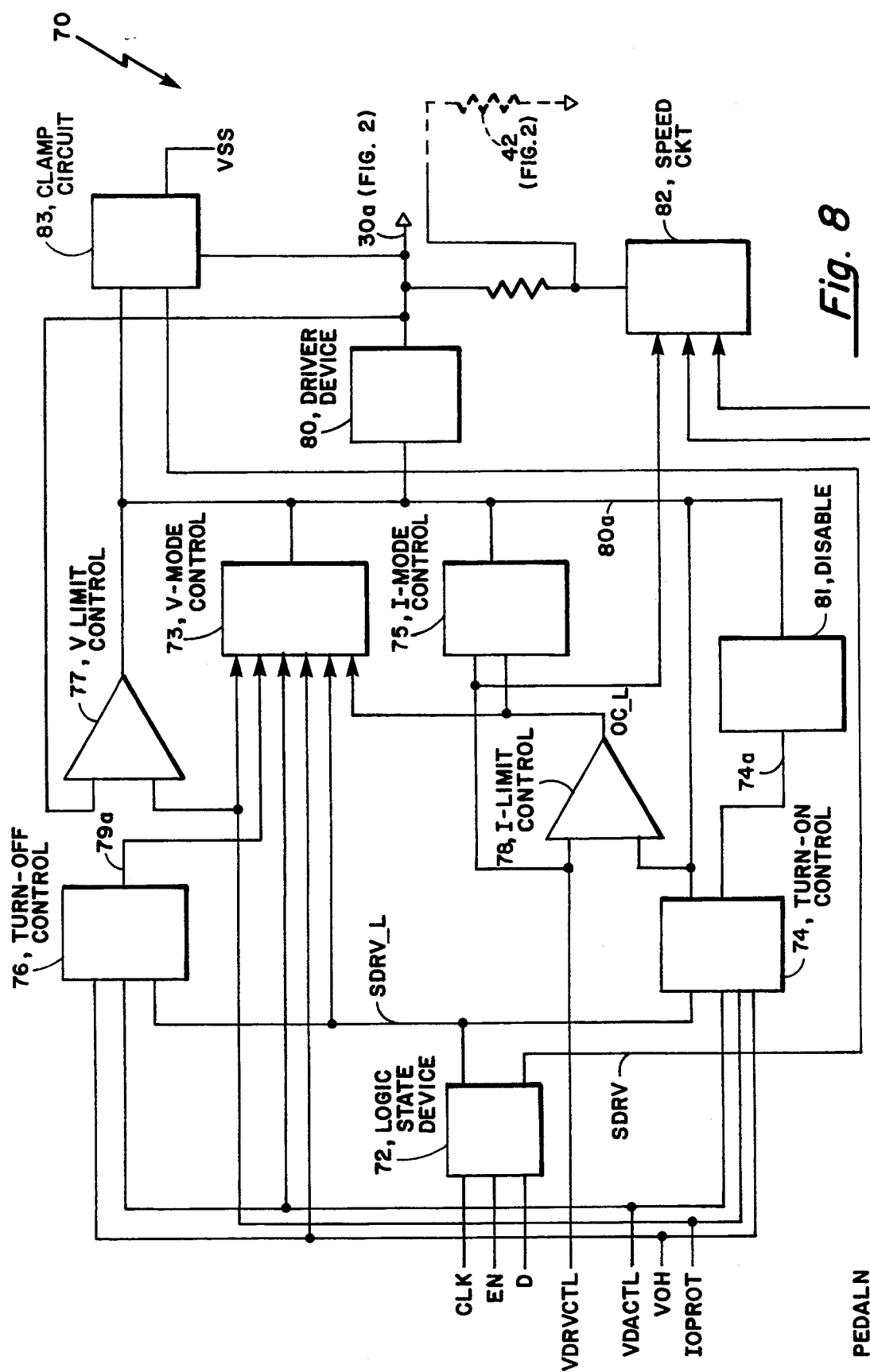
FIG. 8 is a block diagram of a driver used in the integrated bus I/O cell of FIG. 3.

Referring now to FIG. 8, a driver 70 having controlled rise and fall time characteristics is shown to include a logic state device 72 here a conventional master slave D-type flip flop. Logic state device 72 is fed by a clock signal CLK, an enable signal EN, and a data signal D. These signals are logic-type signals provided from a logic circuit (not shown) which the driver 70 interfaces to in one of the modules 12-28 of FIG. 1. From the output of the logic state device 72 is provided a pair of terminals SDRV and SDRV_L. Here SDRV is fed to a turn-on charging current control circuit 74 and a turn-off charging current control circuit 76. The turn-on charging current control circuit 74 and turn-off control charging current circuit 76 are also fed via reference voltages "VDACTL" (FIG. 9C) "VOH" (FIG. 9C) and a electro-static protected voltage signal "IOPROT". IOPROT is provided from signal IO via a resistance on the receiver 90 (FIG. 14).

When a data signal is fed to logic state device 72, the state of the signal is clocked into the device via the clock signal along line CLK. Alternatively, the signal along line CLK could be an asychronous handshaking signal developed by an asynchronous interface (not shown). At a predetermined period of time after the asserting edge of the clock signal, the data appears at the outputs SDRV and SDRV_L of the logic state device 72.

Turn-on control circuit 74 is used to control the rise time of the output signal of the driver device 80, whereas, turn-off control circuit 76 is used to control the fall time of the driver circuit 80.

The turn-on control circuit 74 in response to reference signals VOH, IOPROT, VDACTL and data signals SDRV_L from logic state device 72 provides an output signal along line 80a to charge an input control line to a driver device 80 at a current proportional to the input voltage required to develop a constant reference output current from driver device 80. This provides a fixed time period over which to charge the driver input thus providing a controlled output rise time from the driver.

Correspondingly, the turn-off control circuit 76 is fed a data signal via the SDRV_L output from logic state device 72, as well as reference signals VDACTL and VOH. The turn-off control circuit 76 likewise provides a signal used to discharge the input line of the driver device at a current proportional to the driver input voltage required to return the output of the driver from the driven voltage to a reference voltage or "off state" over a fixed period of time. This also results in a fixed period to discharge the driver gate, thus controlling output fall time from the driver device 80 and hence the driver circuit 70.

Charge current turn on control and turn-off control circuits 74 and 76 also coupled along lines 74a and 76a to a disable circuit 81 and a voltage source mode control circuit 73, as shown. The disable circuit 81 is used to disable the charging current turn on circuit 76 after a predetermined period of time as will be further described below.

The driver 70 further includes, in addition to the voltage source mode control circuit 73, a current source mode control circuit 75, as well as voltage limit control circuit 77 and current limit control circuit 78. The voltage source mode control circuit 73 V-limit control circuit 77, current source mode control circuit 75, and I-limit control circuit 78 are coupled to the input of the driver device 80.

Each of the aforementioned circuits is used to provide selective control to the input or gate electrode of the driver device 80. The driver 70 thus has circuits to permit the driver 70 to operate alternatingly between a voltage source mode and a current source mode when driving a signal from the output 30a of the driver device 80.

Here a relatively large PMOS transistor is used as the driver transistor although other types of transistors could alternatively be used. Since a PMOS device is used as the driver device, a high voltage relative to VSS fed to the gate thereof is used to turn the device off whereas a low voltage relative to VDD is used to turn the device on. Further, since the termination for each I/O cell is coupled to VSS, the driver device 80 drives a logic 1 level by sourcing current to the termination from the VDD supply and releases the line allowing the termination to pull the line down to VSS for a logic zero level. Thus, when placing a logic one on the line 30a, the driver device 80 sources current from VDD.

The driver operates as follows: When driving a logic one from the driver in response to the asserting transition of data from the logic state device 72, via line SDRV_L, turn-on charge control circuit 74 provides a charging current signal on DRVR_GATE line 80a to start lowering the voltage therein.

Since the voltage on DRVR_GATE line 80a is initially higher in magnitude than VDRVCTL, I-limit control circuit 78 asserts a signal which enables the voltage source mode control circuit 73 to also provide an output signal on line 80a. Turn-on charge control circuit 74 is turned off either by disable circuit 81 or by monitoring IOPROT when it is above about 1V. The voltage source mode control circuit 73 lowers the voltage on DRVR_GATE line 80a driving driver transistor 80 on towards a logic "1" level. The voltage source mode control circuit 73 thereafter adjusts the signal magnitude on DRVR_GATE line 80a in accordance with voltage reference signal VOH and output voltage IOPROT. The circuit 73 uses VDACTL to set a current level from the output of the voltage source mode device 80. Whereas, IOPROT is used by the voltage source mode control circuit 73 to adjust the voltage on DRVR_GATE line 80a to provide a constant output voltage relative to VOH from driver device 80 in accordance with loading of the driver device 80.

The V-mode control circuit 73 continues to drive the transistor 80 while the magnitude of the voltage on line 80a is also monitored by the I-limit control circuit 78. When the voltage on line 80a approaches or is substantially equal to the voltage of VDRVCTL, the I-limit control circuit 78 will inhibit the V-mode control circuit 73 from driving the DRVR_GATE line 80a and, correspondingly, the I-limit control 77 circuit will permit the I-mode control circuit 75 to drive line 80a via signal OC_L. This signal is low when driver is at current limit.

When the magnitude of the drive signal on line 80a exceeds a voltage which would cause the output of a transistor 80 to exceed VOH, the voltage limit control circuit 77 causes the output drive line 80a to drop to a voltage below that which would drive transistor 80 to a voltage above VOH by comparing the values of voltages VOH and IOPROT.

I-mode control circuit 75 maintains a signal on line 80a to follow changes in VDRVCTL. The V-limit control circuit 78 compares the voltage on the output of driver device 80 to the magnitude of reference signal VOH. If the voltage on the output IO exceeds VOH, then the V-limit control circuit 77 increases the drive voltage on the DRVR_GATE line 80a to reduce the output voltage from the device. This turns off the I-mode control 75 and turns-on the v-mode control 73 when the I-limit control 77 detects the voltage of DRVR_GATE being greater than the voltage of VDRVCTL.

Accordingly, by use of voltage source mode control circuit 73, I source mode control circuit 75, V- limit circuit 75 and I-limit control circuit 77, the driver transistor 80 is switched between a voltage source mode and a current source mode when driving the driver device 80 to a logic one state, as load current demand varies from below current limit to above current limit.

The driver releases the line IO to provide a logic zero state when the logic state device 72 provides a logic 1 on SDRV_L. The signal is fed to the turn on control circuit 74 and the turn off control circuit 76, as well as the voltage source mode control circuit 73 and the V-limit control circuit 75. These circuits in response cause the signal to the driver device to go to a high voltage level, thus allowing the driver device to release the output line whereas the terminations on other ends of the line (part of the bus interfaces for the other devices) and of this IO cell 70 now pull the line to VSS providing a logic zero level.

The driver 70 further includes an overshoot clamping circuit 83 coupled to the output 30a of driver 70. The overshoot clamp circuit 83 limits positive and negative transient voltage excursions on the output line 30a. The clamping circuit 83 limits positive overshoots by diverting bus signal current into the VSS supply node through a transistor (not shown). The clamping circuit 83 limits negative overshoots by decreasing drive voltage on DRVR_GATE line 80a to prevent complete turn-off of the driver transistor 80 until the current on line 30a falls to near zero.

The clamping circuit 83 is provided to prevent transients on signal lines where multiple drivers can drive the line IO particularly for positive overshoots and to limit negative voltages caused by transients associated with inherent inductance characteristics of the conductor comprising the line 30a (IO).

The driver 70 further includes a speed increase circuit 82 coupled to the output 30a of the driver circuit 70. The speed circuit 82 is fed a logic signal from an LZI output of the receiver 90 (FIG. 3) to sense the logic state most recently received at the receiver 90. The speed circuit 82 is also fed signals PEDALN and VDRVCTL. In response to these signals the speed circuit 82 provides in a portion of the bus cycle after reception of the most recently received logic signal an output signal to precondition the line 30a to the next state of the BUS. Here, the speed circuit 82 operates such that the next state of the line 30a on the bus 30 is the opposite logic state to the state most recently received by the receiver 90.

By preconditioning the output of the line 30a of BUS 30, less voltage swing is required on the line 30a during a change of state thus improving performance by reducing the amount of time necessary to change logic states on the line 30a. If the next state of the bus is the same as the previous state, then the preconditioning continues so that when the transition occurs it will be at an increased speed. No significant penalty is incurred since the bus remains in the correct state.

Referring to FIGS. 9A and 9B, an illustrative example of the driver circuit 70 generally discussed in conjunction with FIG. 8 is shown to include the turn-on control circuit 74 including a threshold detector circuit 74a which is coupled to a transistor stack 74b.

Here each transistor is denoted by a reference designation such as P1 which is unique for the particular Figure. Other figures may use the same reference number when designating transistors in the circuit described in the figure. Further, from here on in each transistor is designated by a size with the first number being the width and the second number, separated by a period "." being the length.

The threshold detector 74a includes an NMOS transistor P20 coupled to a PMOS transistor P18 which is coupled to a PMOS transistor P17. PMOS transistor 17 has a gate electrode which is fed by the signal DISABLE from the disable circuit 81 whereas transistors P18 and P20 have gate electrodes coupled to SDRV_L. The threshold detector further includes transistors P19 and P21 which are used in turning off the circuit.

The stack 74b includes transistors P22 through P24, as shown. The gate of transistor P22 is coupled to the drain of transistor P19, whereas gates of transistors P23 and P24 are coupled to respectively VOH and VDACTL. The relative values of the voltages VOH and VDACTL determine the current flow through the stack when the transistor P22 is turned on.

A circuit used to set the value of VDACTL and hence the rise and fall time of the driver and the output current from the driver will be discussed in conjunction with FIG. 9C.

Initially, assuming that SDRV_L is high then transistor P17 is on (since the disable circuit via line disable, has not yet disabled the turn-on charge control circuit) and transistor P18 is off. As SDRV_L transitions low, transistor P18 is driven on while transistor P20 is driven off. At this juncture, transistor P19 is still off since its gate electrode is coupled to IOPROT which is still in a low state due to the previous state on the bus as determined from SDRV_L having been at a logic one and transistor P21 is also off since the disable output is high.

In response to the signal SDRV_L turning on transistor P18, transistor P18 causes a large current to be drawn from transistor P22 via a signal on the gate electrode of transistor P22. Transistor P22 is sized to source a large current. Hence, transistors P18 and P22 sink a current from DRVR_GATE line 80a. The amount of current on DRVR_GATE line 80a is determined in accordance with the values of voltage of VOH and VDACTL fed to the gate electrodes of transistors P23 and P24.

Transistors P19 and P20 are used to control and hold turn-off of the charge control circuit 74. Transistor P21 turns off the charge control circuit 74 via a signal from the disable circuit 81.

Disable circuit 81 includes here two inverters (transistors P46 and P47, and transistors P43 and P44) coupled together, as shown. Transistors P43 and P44 have gate electrodes coupled to signal SDRV. Thus when SDRV is high and, correspondingly state device 72 is providing a logic one to be driven from the driver 70, two inverter stages later, a logic one will appear on line DISABLE causing P21 to turn on shunting the gate of P22 to VSS and thus turning off the turn on charge control circuit 74. The DISABLE signal also turns off P17.

The turn-on control circuit 74 is also turned off or disabled by the level of voltage signal on line IOPROT, rising to above about one volt causing transistor P19 to turn on coupling CHARGE line to VSS and turning off P22.

The charge current control circuit 74 provides a signal to charge DRVR_GATE line 80a by drawing a current related to the amount of current drawn by a representative pair of transistors in the VDACTL control circuit (FIG. 9C). This current in turn is related to the current drawn through the representative stack in accordance with the value of an external resistance provided to set the current through the representative stack.

The turn-on charge control circuit 74 provides an output signal coupled to DRVR_GATE line 80a which feeds the other corresponding circuits as mentioned. The voltage source mode control circuit 73 includes a unity gain amplifier 73a having transistors P3 and P5 with control electrodes coupled respectively to signals VOH and VDACTL. The signal IOPROT is coupled to the gate electrode of P4 correspondingly the inverting input of the unity gain amplifier provided by transistors P4, P3, and P5, whereas the signal VOH is coupled to the non-inverting input of the unity gain amplifier. Thus signal VOH is used as a reference for the output of the unity gain amplifier.

The voltage source mode control circuit 73 further includes transistor P13 having a gate electrode coupled to signal OC_L provided from the output of the I-limit control circuit 77 and having a drain electrode coupled to DRVR_GATE line 80a. When the driver 70 is driving a logic one state on output IO, signal OC_L from the I-limit control circuit 77 is initially high causing the transistor P13 to couple the output from the unity gain amplifier (drain of transistor P13) to the line DRVR_GATE 80a. Thus, the signal OC_L from I-limit control circuit 77 permits transistor P13 to conduct placing at the output of P13 and on DRVR_GATE line 80a the current from the output of transistor P3. The voltage provided on the DRVR_GATE line 80a is related to the relative values of VOH and IOPROT, and VDACTL which controls the current source transistor P5.

The voltage source mode control circuit 73 further includes transistors P1, and P6. Transistor P1 has a gate electrode coupled to transistor P2 in the turn-off charging current control circuit 76. Transistor P2 also provides for V-source mode operating current from transistor P1 through current flow in transistors P2 and P32, as well as transistors P7 and P33. The amount of current from P7 and P33 is controlled by the relative values of voltage from signals VOH and VDACTL. Transistor P6 has a gate electrode coupled to signal SDRV_L and is used to sense the state of a logic signal provided from the output of state device 72.

Accordingly, when state device 72 provides a logic 1 signal, SDRV_L will be at a logic 0 level. This drives transistor P6 to an off state permitting the voltage source mode control circuit 73 to drive DRVR_GATE line 80a. If however, SDRV_L is high and thus the state device is driving a logic zero from the driver 70, then the transistor P6 turns on, coupling the VDD supply voltage to the source connections of transistors P3 and P4. A voltage level of VDD at the connection of the transistors P3 and P4 turns off or inhibits both transistors and hence the voltage source mode control circuit 73, since the difference in voltage between VOH and the source of P3 would be insufficient to turn on transistor P3.

Accordingly, signal SDRV_L controls the state to be driven on the DRVR_GATE line 80a through transistor P6.

The I-limit circuit 77 (FIG. 9B) includes a unity gain amplifier comprising transistors P9, P10 and P11 arranged as an amplifier. Transistor P10 is fed by the signal on DRVR_GATE line 80a at the gate electrode thereof whereas, transistor P9 has a gate electrode fed by signal VDRVCTL. I-limit control circuit 77 further includes transistors P8 and P12, as shown. When the voltage on DRVR_GATE line 80a is less than VDRVCTL, the transistor P8, P10, and P12 conduct placing signal OC_L in a low state causing the drain electrode of P12 to approach VSS. This signal OC_L is fed to the voltage source mode control circuit 73 disabling the transistor P13 as described, while enabling transistor P37 in the current source mode control circuit 75. Thus line OC_L is used to disable the voltage source mode control circuit 73 and enable the current source mode control circuit 75.

The current source mode control circuit 75 includes transistors P37, P36 and P35 arranged to provide a unity gain amplifier type circuit in which an output voltage at line 80a corresponds to the voltage VDRVCTL. Here the current source mode control circuit 75 thus provides an output signal to drive DRVR_GATE line 80a to a voltage related to VDRVCTL to maintain the driver output IO at a constant current in accordance with changes in load beyond the current limit from devices connected to the output line 30a of driver 70.

The output 30a is coupled through a resistor 90a which is part of receiver 90 (FIG. 3). Thus the output fed on line 30a produces the signal IOPROT which is fed to a gate electrode of a transistor P41 in the voltage limit control circuit 75. The voltage limit control circuit 77 further includes transistors P39 and P40 each having gate electrodes fed by signals OC_L and VOH, respectively. When the voltage IOPROT exceeds VOH and OC_L is low, the voltage limit control circuit 77 stops diverting current through transistor P41 from transistor P39. A current flows through transistor P40 forcing current into the line DRVR_GATE line 80a to raise the voltage level of the gate drive to the PMOS drive transistor P45 tending to reduce the output voltage from the driver device and to return mode of operation to a voltage source mode.

The turn-off charge current control circuit 76 is used to turn off the driver device 80 and provide a controlled output fall time. The turn-off charge control circuit is shown to include two stacks of transistors. The first stack comprised of transistors P15, P14, and P16 is fed via signal SDRV_L, VOH, and VDACTL, respectively. When SDRV_L is high and consequently the state device is no longer controlling the driver device to drive a logic one, transistor P15 turns on drawing a current from a transistor P2, as shown. A mirror transistor P1 which is part of the voltage source mode control circuit 73 souces current which brings DRVR_GATE line 80a back to VDD thus turning off the driver device 80 and hence providing a controlled fall time at the output of the driver 70. The amount of current drawn from P1 and P2 is controlled by the relative values of voltage from signals VOH and VDACTL.

Referring now to FIG. 9C, a control circuit 87 used to provide reference voltage signal VDACTL is shown to include a terminal RRISE (PAD) to which is coupled an external resistance 53 (FIG. 2) and an amplifier 87a and to VDD here a compensated amplifier having a low offset voltage. The external resistance 53 is coupled to the non inverting input of the amplifier 87a whereas the inverting input of the amplifier is coupled to the signal VDRVCTL from FIG. 6. The output of the amplifier is the signal VDACTL and the signal VDACTL is connected to the control input (gate) of a transistor P11 having a drain connected to the source of transistor P10 and a source connected to VSS. The gate of transistor P10 is coupled to VOH whereas the drain of transistor P10 is coupled to the external resistance and the non inverting input of the amplifier 87a. The transistors P11 and P10 are each sized to provide a ratio which is the same for each VOH and VDACTL pair stack used in the driver 70. The ratio used here is 4.5:1 although other ratios can be used. These transistors P11 and P10 are used as representative devices to provide a compensated signal VDACTL to take into consideration semiconductor processing variations as well as changes in electrical characteristics of the circuits in the IO cell 40 caused by variations in temperature, supply voltage and potentially help compensate for changes in characteristics caused by aging. The reference voltage signal VDRVCTL is provided from the output of amplifier 54 (FIG. 6) in accordance with the transconductance of the transistor P4 (FIG. 6). If the transconductance of the transistor P4 is low (an indication of a slow process for the batch of circuits or a high operating temperature) VDRVCTL will be at a voltage further away from VDD. This voltage is provided across RRISE resistor 53 producing a larger current through the stack 88 of transistors P10 and P11 controlled by VOH and VDACTL.

When VOH and VDACTL are used to control a similar stack of transistors in the driver or the termination, they will provide a relatively larger current from the respective stack.

Correspondingly, if the value of VDRVCTL is closer to VDD an indication of a fast process or lower operating temperature, the current from the stack 88 and hence corresponding stacks in the driver and termination will be lower.

Thus, in the driver, the stack transistors P23 and P24 will provide a variable amount of current from the turn-on charge control circuit 74 (FIG. 9) to charge the DRVR_GATE line at a rate to permit the gate of the driver transistor P45 to reach the current limit voltage level matching VDRVCTL voltage in a fixed period of time substantially independently of variations in the characteristics of the devices caused by processing, temperature and aging effects.

Figure 10:
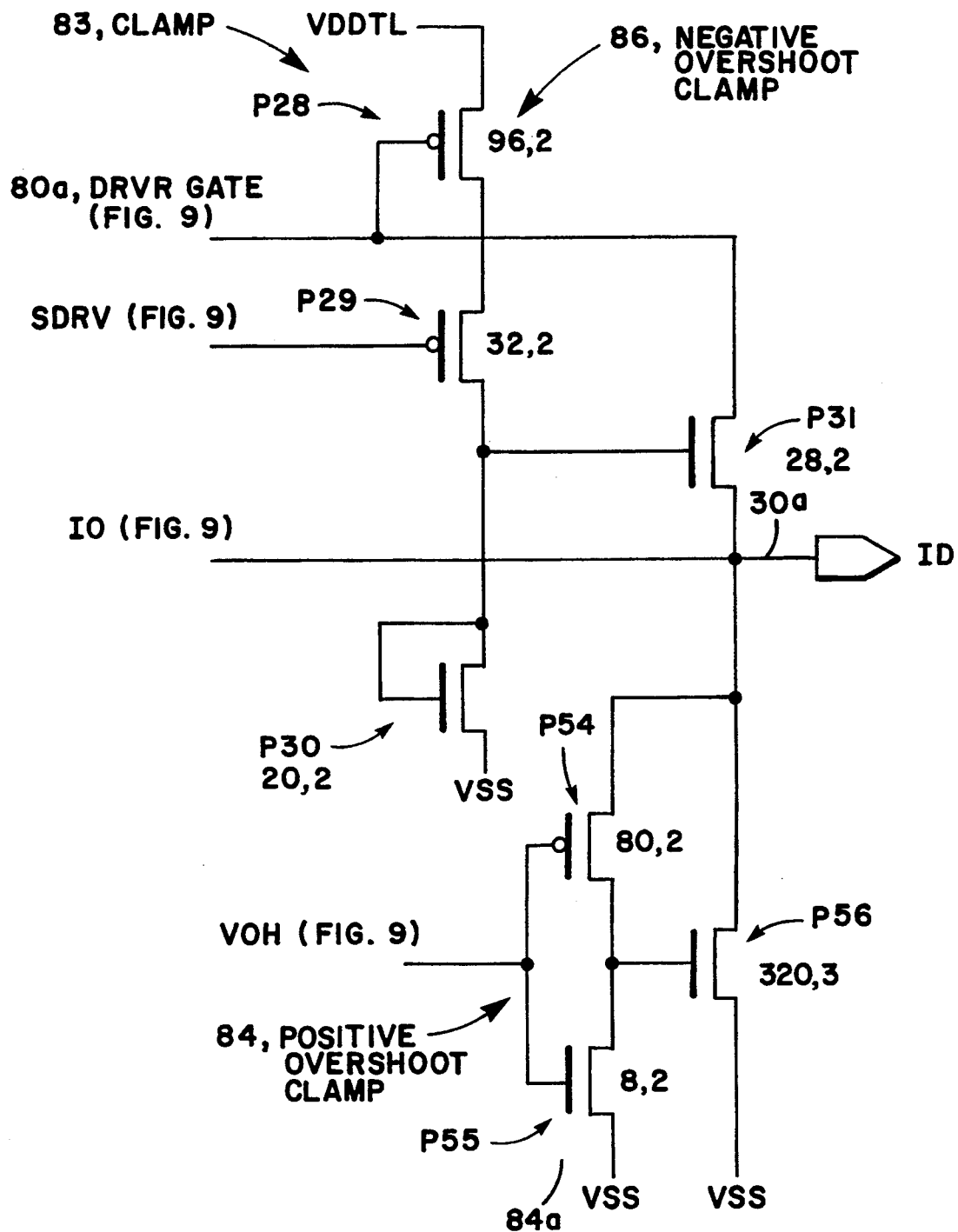
FIG. 10 is a schematic diagram of a clamping circuit for the driver of FIG. 8.

Referring now to FIG. 10, the overshoot clamp circuit 83 is shown to include a positive overshoot clamp circuit 86 and a negative overshoot clamp circuit 84. The positive overshoot clamp circuit 86 is used to clamp the output voltage on line IO to a value not greater than the maximum output high voltage VOH plus about 1.0 volts programmed for the driver circuit 70, whereas, the negative overshoot clamp circuit 84 is used to clamp the voltage on line IO at a value not less than about 0.0 volts.

The positive overshoot clamp circuit 86 includes an inverter comprised of transistors P54 and P55 and an output transistor P56. The inverter 84a is a high threshold inverter, i.e., the size of each of the transistors is selected to provide a high turn-on threshold for transitioning from a logic 0 to a logic 1 state. Accordingly, PMOS transistor P54 is preferably approximately ten times larger than the NMOS transistor P55 of the inverter 84a. The inverter is coupled between the IO line 30a and VSS. The input to the inverter is signal VOH. The output of the inverter is taken between transistors P54 and P55 at their drains and is coupled to the gate electrode of transistor P56. The drain of electrode P56 is coupled to the bus signal line 30a, whereas the source of transistor P56 is coupled to the VSS.

Transistor P56 is biased to turn on when the voltage on line IO exceeds the voltage limit value VOH plus about 1.0 volts. Thus NMOS transistor P56 diverts excess current on the bus line 30a into VSS, clamping the voltage on line 30a at a maximum voltage of about VOH plus about 1.0 volts. When the bus signal voltage falls below the limit value VOH, the inverter 84a turns off NMOS transistor P56 thus inhibiting diversion of bus signal current into VSS. By using the inverter to control the NMOS transistor P56, the undesirable capacitance commonly associated with a diode type clamp is eliminated. This provides improved, that is, faster system operation since there is no recovery switching time associated with the transistor as there is with that of a junction diode. Moreover, the excess capacitance loading of the bus line typical of the diode approach is reduced by using the transistor 56.

The negative clamp circuit 84 is shown to include transistors P28 through P31. Transistors P28 and P29 have gate electrodes fed, respectively, by DRVR_GATE signal line 80a and signal logic SDRV from state device 72 (FIG. 8). The signal DRVR_GATE is also coupled to the drain electrode of transistor P31 having a source electrode coupled to line IO. Transistor P28 has a drain electrode coupled to a source electrode of transistor P29 with the drain electrode of transistor P29 coupled to the gate of transistor P31, as well as to a resistance provided by transistor P30 having its gate electrode coupled to its source, as shown. Transistor P30 provides a voltage limit connection between transistor P29 and reference potential VSS, analogous to a diode forward voltage drop above VSS.

Negative overshoot clamp circuit 84 operates as follows: When DRVR_GATE line is driving driver device P45 (FIG. 9), transistor P28 is on sourcing current into P29. Transistor P29 will turn on if SDRV goes low that is if the driver 70 discontinues or is not driving a logic one level. If a negative voltage is induced on line 30a from the current flowing in the inherent inductance of the line, then transistor P31 will stay on drawing more current from DRVR_GATE line 80a. This effectively delays the time when the driver device 80 (transistor P45 FIG. 9) turns off forcing the driver device 80 (transistor P45) to maintain the line 30a above about 0.0 volts. This is the preferable way to limit negative excursions because no current is diverted into VSS but rather is still flowing from VDD until induced current approaches zero.

Figure 11:
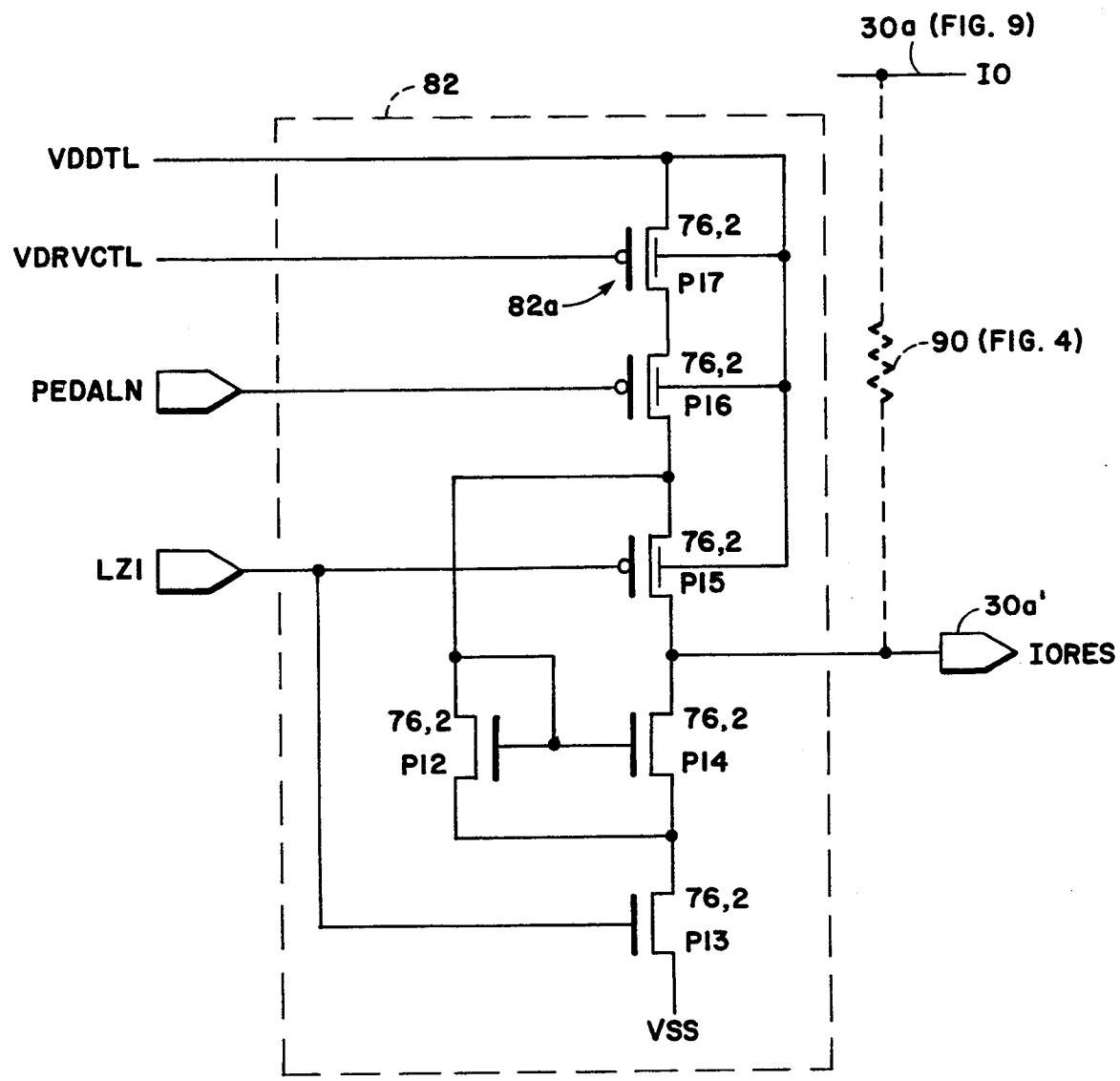
FIG. 11 is a schematic diagram of a speed cell circuit for the driver of FIG. 8.

Referring now to FIG. 11, the speed circuit 82 is shown to include PMOS transistors P17 and P16 having gate electrodes coupled to lines VDRVCTL and PEDALN, respectively. Transistors P17 and P16 are arranged as a stack 82a having a source electrode coupled to a drain electrode of a succeeding transistor in the stack 82a. Coupled to the stack 82a is a transistor P15 having a gate electrode fed by signal LZI (FIG. 14). Transistor P17 has its source electrode coupled to voltage VDDTL and transistor P15 has its drain electrode coupled to line IORES 30a'. Line IORES, as explained earlier in conjunction with FIG. 5, is coupled via a resistance 49b (FIG. 14) to line 30a (IO) (FIG. 9).

The speed circuit 82 further includes a pair of NMOS transistors P12 and P14, with transistor P14 having a drain electrode coupled to line 30a' and a source electrode coupled to the source electrode of transistor P12 and transistor P12 has a drain electrode coupled to the drain of transistor P16 as shown. The gate electrodes of transistors P12 and P14 are coupled together and to the drain electrode of transistor P12. A sixth transistor P13 provides a switch to VSS for transistors P12 and P14 and has a drain electrode coupled to the common connection of the source electrodes of transistors P12 and P14 and, further, has a source electrode coupled to VSS.

The gate electrode of transistor P13 is coupled to terminal LZI the redundant logic output from the receiver circuit 90 (FIG. 14). A current proportional to the driver current limit controlled by the value of VDRVCTL flows through the stack 82a (transistors P17 and P16) and in accordance with the state of the signal on line LZI, current from stack 82a will flow either out of line 30a' and thus through line 30a via resistance 49b or into line 30a (terminal IO) and hence (line 30a') through resistance 49b towards VSS.

When LZI is at a logic 1 state transistor P15 is off and a current from the stack 82a flows through transistor P12 to transistor P13. Since the gate of transistor P12 is coupled to the gate of transistor P14 and, further, since the gate is also coupled to the drain of transistor P12, transistor P14 provides a mirror current flow in response to the current through transistor P12. Thus if the transistors are of equal size, a substantially similar current will flow from terminal IORES through transistor P14 into transistor P13 to VSS. Thus, with the state of the logic signal received on line 30a, at a logic one state current is drawn into the speed circuit 82 causing the voltage on the line 30a to fall below that corresponding the level of the received logic high state.

This preconditioning of line 30a aids in reducing the time period required to transition from a logic high state to a logic low state if the next state of the bus makes that transition.

For a received logic 0 state, the signal on line LZI turns on transistor P15, thus diverting the current through transistors P17 and P16 through transistor P15 and out onto line IORES.

This preconditioning of line 30a aids in reducing the time period required to transition from a logic low state to a logic high state if the next state of the bus makes that transition.

Thus, by examining the output from the receiver 90 (FIG. 14), the current from the line IO 30a to IORES 30a' is preconditioned to an assumed opposite next logic state to be driven on the bus line 30a, since the signal LZI corresponds to the true state most recently received at the receiver 90.

Thus, if the present state received at the receiver is a logic high level, then LZI will be at a logic 1 level which will turn off transistor P15, turn on transistor P13 and divert current through transistor P12, producing in response a mirror current through transistor P14.

On the other hand, if the data received at the output of the receiver is a logic low level, then LZI will be at a logic 0 level. This will turn on transistor P15, diverting current from transistors P17 and P16 through transistor P15 and out to IORES line 30a'.

Since the settling time of a line on a bus is greatest during those cycles where data is changing from a logic 1 to a logic 0 state or, conversely, from a logic 0 state to a logic 1 state, the above mentioned preconditioning of the bus line 30a, (30a') to assume the next logic state, decreases settling time of the line after the transition since a smaller voltage is necessary to change the state of the line.

A logic signal has a given noise margin or band of voltages about the transition threshold window which the logic signal must not fall into in order to differentiate between logic levels. In a cycle where the given data bit does not change state, the noise margin is very large. Conversely, if the data bit transitions the noise margin limits the bus settling time. At every module bus data is received at each cycle boundary and received state is used to precondition the bus for the following cycle. The preconditioning provided by the speed circuit 82 is provided on the assumption that a bus transition will occur at the next state. Thus the current on the bus is driven towards the assumed direction, thus moving the bus voltage towards the received threshold window. This has the effect of reducing the noise margin for instances where there is no transition but increases the noise margin (effectively) for instances where there is a transition.

Figure 12:
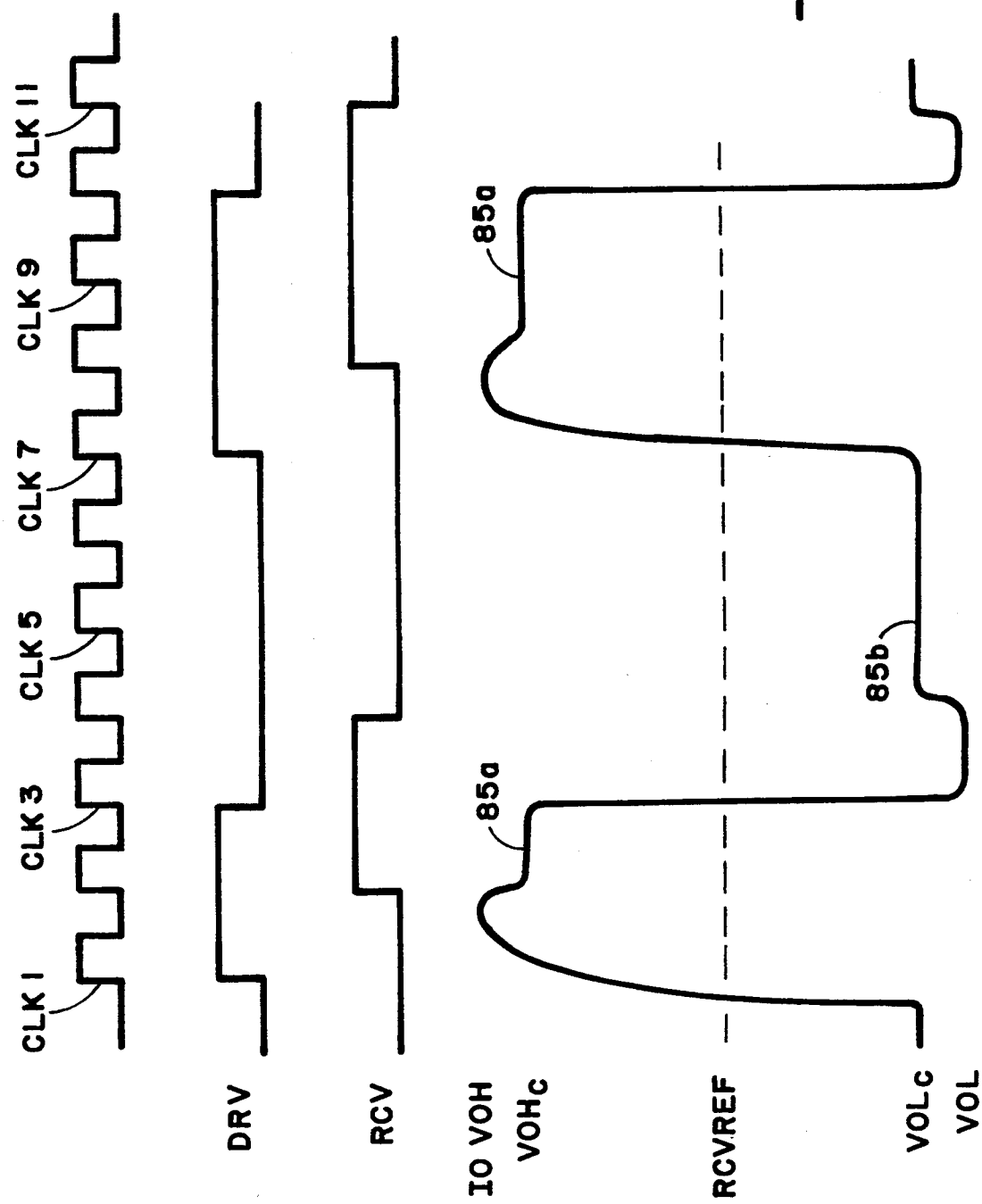
FIG. 12 is a timing diagram useful in understanding the speed cell circuit of FIG. 11.

As shown in FIG. 12, the voltage on line IO is not tied to a fixed rigid voltage. When the first rising clock edge of clock signal CLK provides a logic level 1 at the output of the state device 72 denoted in FIG. 12 at line DRV, this logic state produces the voltage 85a, as illustrated, on line IO. Thus voltage on line IO is here shown starting a voltage level $VOL_c$ which is above the voltage level VOL, the minimum voltage for a logic 0 state in the receiver.

At the moment of the transition of driver when the voltage on line IO transitions quickly up to a voltage VOH, the line IO remains at VOH Until the receiver and the speed cell 82 switch logic state at next rising clock edge. The voltage stays at level VOH for one cycle, after which point the voltage drops to a level $VOH_c$ which is at a value 85a below the level VOH, if it is not transitioning low.

As shown in FIG. 12, for the first data cycle, the data changes from the logic 1 state from the driver to a logic 0 state. The logic 1 state is clocked into the receiver on the next clock cycle CLK2 and the LZI signal from the receiver is sensed by the speed circuit 82 in the driver 70 causing the driver to change the voltage on line IO to drop to the level VOL. The voltage stays at VOL for one cycle, at which point the voltage then rises again to $VOL_c$.

During the next clock cycle CLK3, the logic level on the line DRV is again a logic 0 and, thus, the voltage on line IO stays at $VOL_c$. On the fourth clock cycle CLK4 the driver transitions to a logic high level and, thus, the voltage on line IO transitions from $VOL_c$ up to VOH remaining at VOH during the first cycle and dropping to $VOH_c$ during the second cycle.

At each one of the points 85a, 85b the speed circuit 84 preconditions the bus for the next logic state which is assumed to be a logic low level, thus dropping the voltage on the bus from the level VOH to $VOH_c$ or raising the voltage from VOL to $VOL_c$.

This preconditioning of the bus 30 provides an improvement in the speed on the bus 30. The improvement in speed is related to the value at which $VOL_c$ and $VOH_c$ are set. These values, in turn, are related to the value of the driver current limit controlled by the voltage VDRVCTL. This current limit is proportional to voltage reference VIH divided by external resistance RTERM (FIG. 6).

Figure 13:
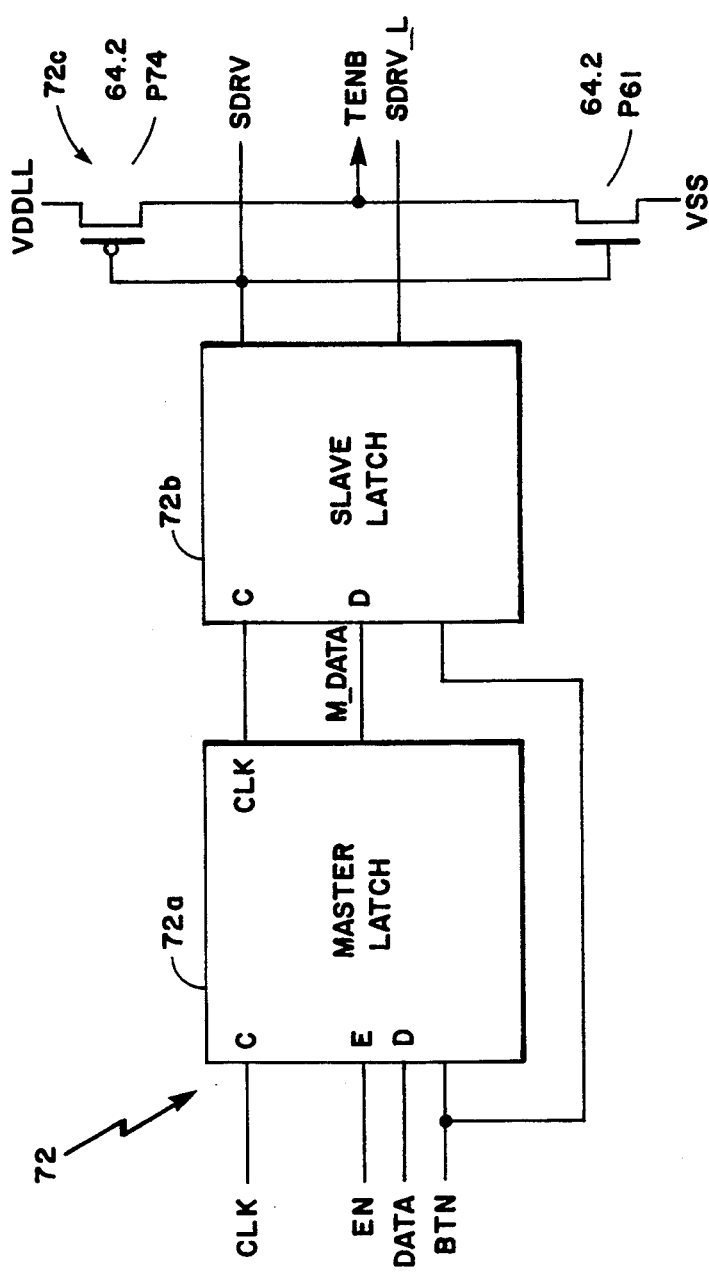
FIG. 13 is a block diagram of a logic state device used in the driver of FIG. 8.

Referring now to FIG. 13, the logic state device 72 is shown to include a master latch 72a and a slave latch 72b. The state device 72 further includes an inverter 72c which is fed via the output signal SDRV from slave latch 72b. The inverter 72c comprised of a PMOS and NMOS transistor provides signal TENB which is used to disable the termination associated with the particular driver in the IO cell when the output of a state device 72 is in a state that will cause the associated driver of the particular IO cell to drive its own IO line. Here the driving state of the cell is a logic 1 level. Thus when signal SDRV is a logic 1 level, transistor P61 conducts causing line TENB to go to a logic 0, disabling termination.

The master latch 72a receives data at terminal DATA and a clock signal at terminal CLK. Assuming that enabling signal at terminal EN is in a state which enables one data, the data is latched in master latch 72a and is presented at the output at M_DATA and is latched by the slave latch 72b at a next falling clock edge. In general, any conventional master-slave flip-flop would be suitable for logic state device 72.

Figure 14A:
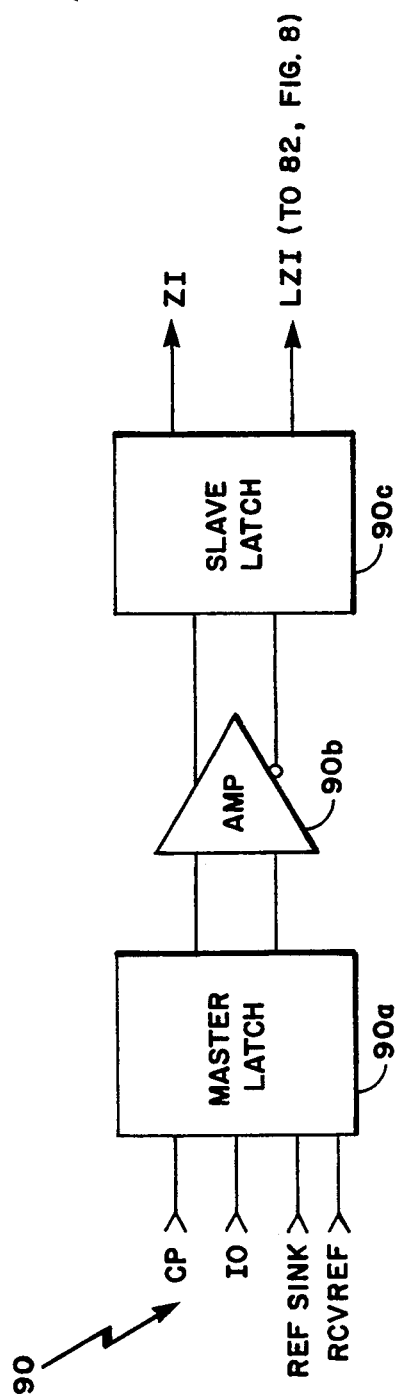
FIG. 14A is a block diagram of a bus receiver.

Referring now to FIG. 14A, the receiver 90 (FIG. 3) is shown to include a latch 90a coupled directly to the bus line IO of the bus 30 (FIG. 1). The latch is also fed via a system or bus clock signal CP used to clock in data to the latch 90a and a reference voltage REFSINK from which a reference threshold voltage level is provided. The outputs from latch 90a are a latched, unamplified data bit from line IO and a latched receiver reference voltage derived from the signal REFSINK. These signals are amplified by an amplifier type of device 90b and are then fed to the second latch 90c. At the outputs of the second latch 90c are thus provided the signals ZI and LZI.

The receiver 90 is a master-latch/amplifier/slave-latch arrangement. This arrangement has the unamplified signal from the bus latched in the latch 90a prior to being fed to a state determining circuit or an amplifier. This arrangement of latching before amplifying eliminates the setup time associated with prior receiver arrangements where an amplified bus signal is provided before entry into a master-slave latch. After latching of the unamplified bus signal, the signal is amplified and resolved to provide a determination of the represented logic state in accordance with a receiver reference voltage transition threshold provided from REFSINK. The resolved and amplified logic state is then latched into the slave latch 90c, providing in response the outputs ZI and LZI.

Figure 14B:
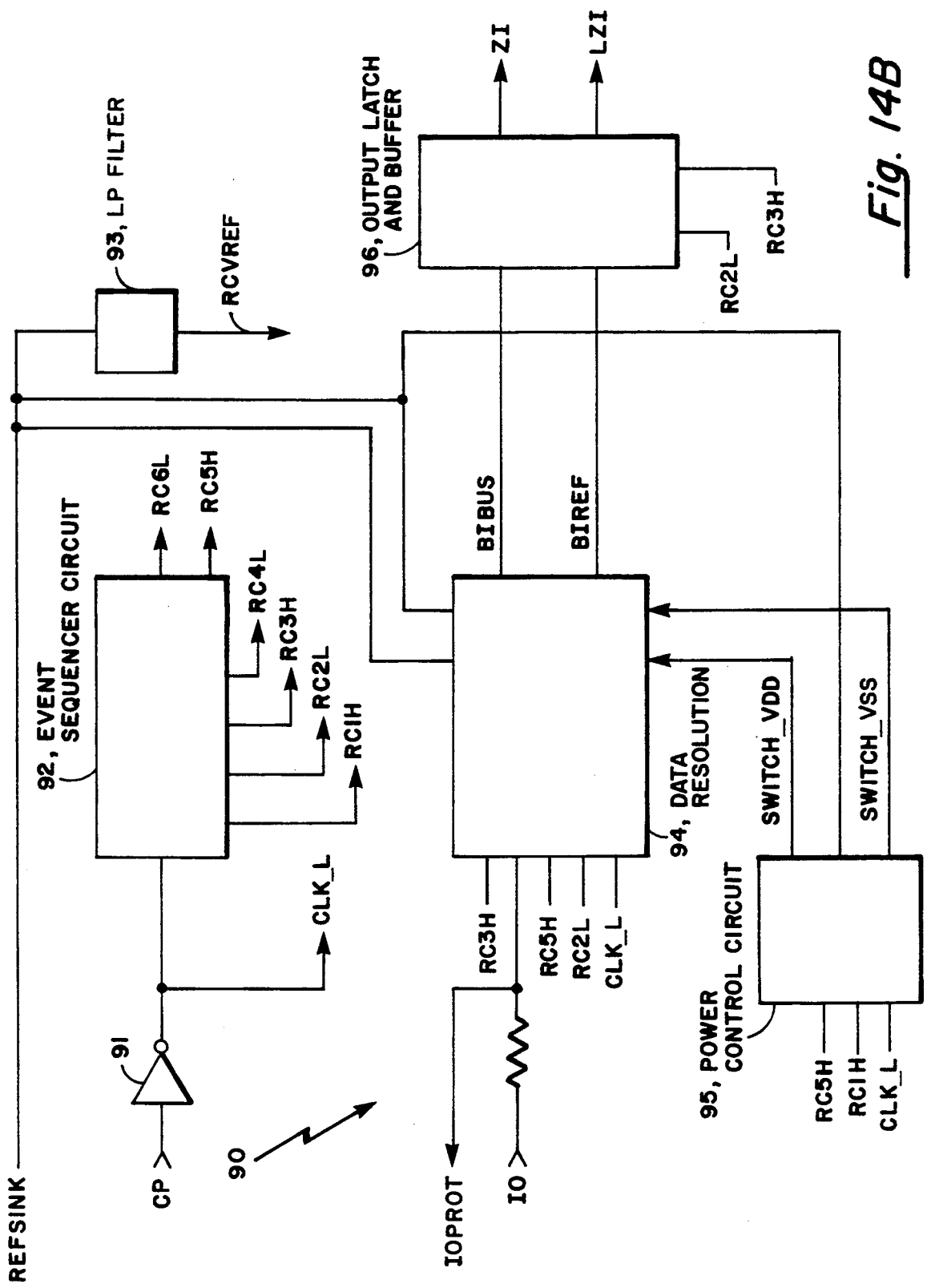
FIG. 14B is a block diagram of an embodiment of the receiver of FIG. 14A.

Referring now to FIG. 14B, the receiver 90 is shown to include an event sequencer circuit 92 which is fed via an inverter 91, an opposite phase CLKL of the external clock signal CP from the system employing the receiver 90. The clock phase CLKL is provided from the output of inverter 91 and is fed to the event sequencer circuit 92. The event sequencer circuit 92 provides in response to the clock signal CLKL, clock phases RC1H, RC2L, RC3H, RC4L, RC5H and RC6L, as shown. Each of the signals RC1H through RC6L are selectively delayed alternating phased clock signals and are used to control the clocking of events in each of the circuits to be described.

Figure 15A:
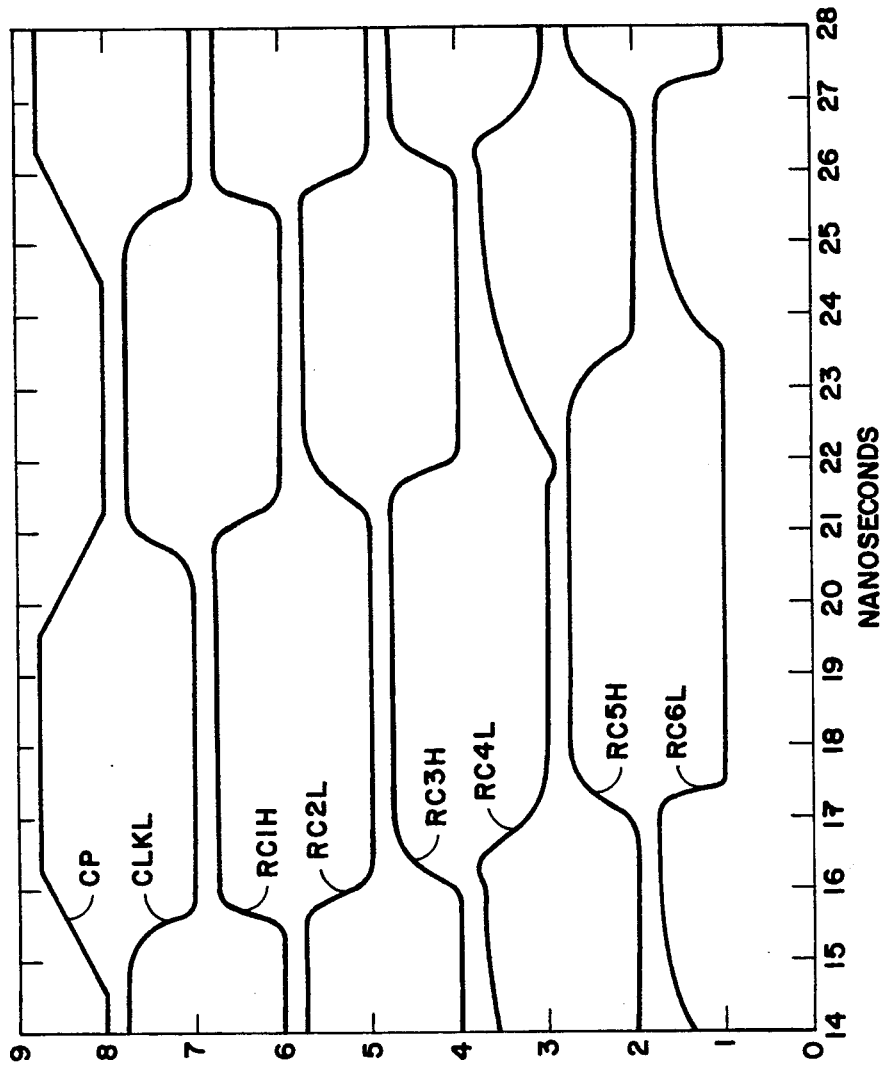
FIGS. 15A and 15B are timing diagrams useful in understanding signal timing relationships in the receiver of FIG. 14B.

Here an exemplary timing diagram showing the relationship between the aforementioned clock signals is illustrated in conjunction with FIG. 15A. Each succeeding one of the clock phase signals CLKL, RC1L etc. is successively delayed a predetermined amount in accordance with the size of the inverter provided to generate the respective signal. These delays are used in the receiver 90 in order to control timing of events in the device.

The event sequencer circuit 92, fed by clock signal CLKL, provides signals RC1H through RC6L to a data resolution circuit 94, a power control circuit 95 and an output latch and buffer circuit 96 as needed. The data resolution circuit 94 is also fed via signal IO (FIGS. 3 and 14A) and via a switching threshold reference signal RCVREF to provide in response thereto differential output logic states on BIBUS and BIREF, as shown. The data resolution circuit 94 is further fed switched power and reference signals here SWTCH_VDD and SWTCH_VSS, as well as clock phase signals CLKL, RC2L, RC3H and RC5H, as also shown.

Figure 16:
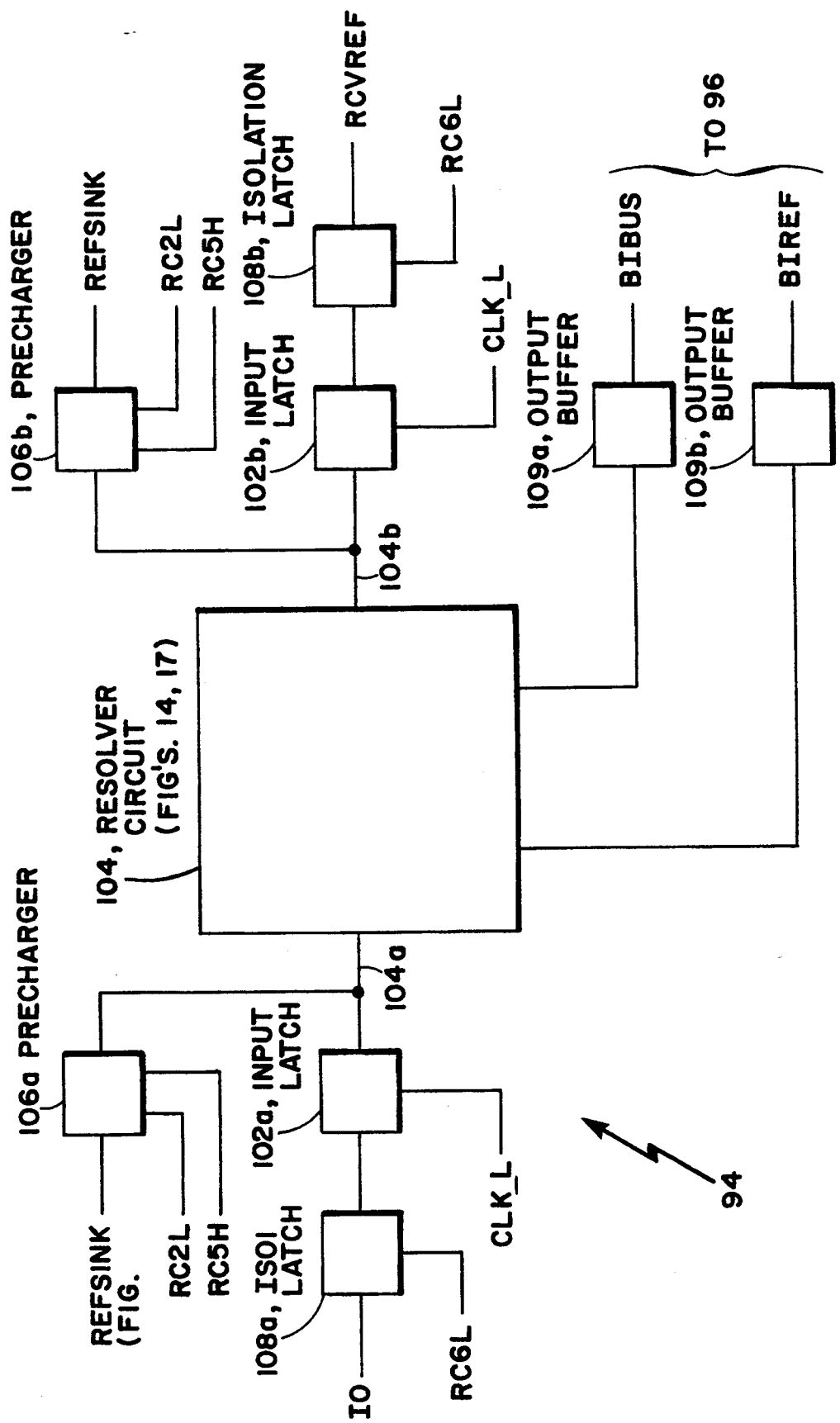
FIG. 16 is a block diagram of a data resolution circuit used in the receiver of FIG. 14B.

The data resolution circuit 94 as will be described in conjunction with FIG. 16, is controlled by clock phases CLKL, RC2L, and RCSH and RC6L. The data resolution circuit 94 latches data directly from the bus line IO and determines or resolves the logic state of the latched data providing differential logic output signals on lines BIBUS and BIREF.

The output latch and buffer 96 receives the logic state signals on line BIBUS and BIREF and provides in response thereto an output on signal ZI which is used by the remainder of the application specific integrated circuit (not shown), as generally described in conjunction with FIG. 2. The output latch and buffer circuit 96 further provides signal LZI which is here dedicated to use by the speed circuit cell (FIGS. 8 and 11), as generally described above. The output latch and buffer circuit 96 is controlled via clock phase signals RC2L and RC3H, as also shown.

The receiver is here a low setup time, low propagation delay device; i.e., the time required for the signal on line IO to propagate through the circuit and be valid after the reception of the clocking edge of signal CP is relatively small. Here the setup time is approximately minus 50 pico seconds or essentially there is no setup time requirement. Here also the hold time is about 300 picoseconds. The receiver 90 is further characterized as having a relatively low propagation delay; i.e., the delay through the circuit 90 between the signal on IO relative to the clock phase CP to the output ZI. Here the propagation delay is on the order of less than 1.5 nanoseconds.

Referring now to FIG. 16, the data resolution circuit 94 (FIG. 14B) is shown to include an input latch comprised of circuits 102a and 102b, as shown, which are coupled, respectively, between line IO and line RCVREF and a resolver circuit 104. Input latches 102a, 102b are used to latch a voltage level associated with signals on line IO and line RCVREF at a selected time period in accordance with timing signals provided via clock signal CLKL.

The latches 102a and 102b are thus used to isolate the signals IO and RCVREF, as captured by the data resolution circuit 94, from the remainder of the receiver 90 during a data resolution phase of the receiving cycle for receiver 90. In particular, input latches 102a, 102b are used to isolate the resolver circuit 104 from the remainder of the receiver and the system incorporating the receiver.

Figure 18:
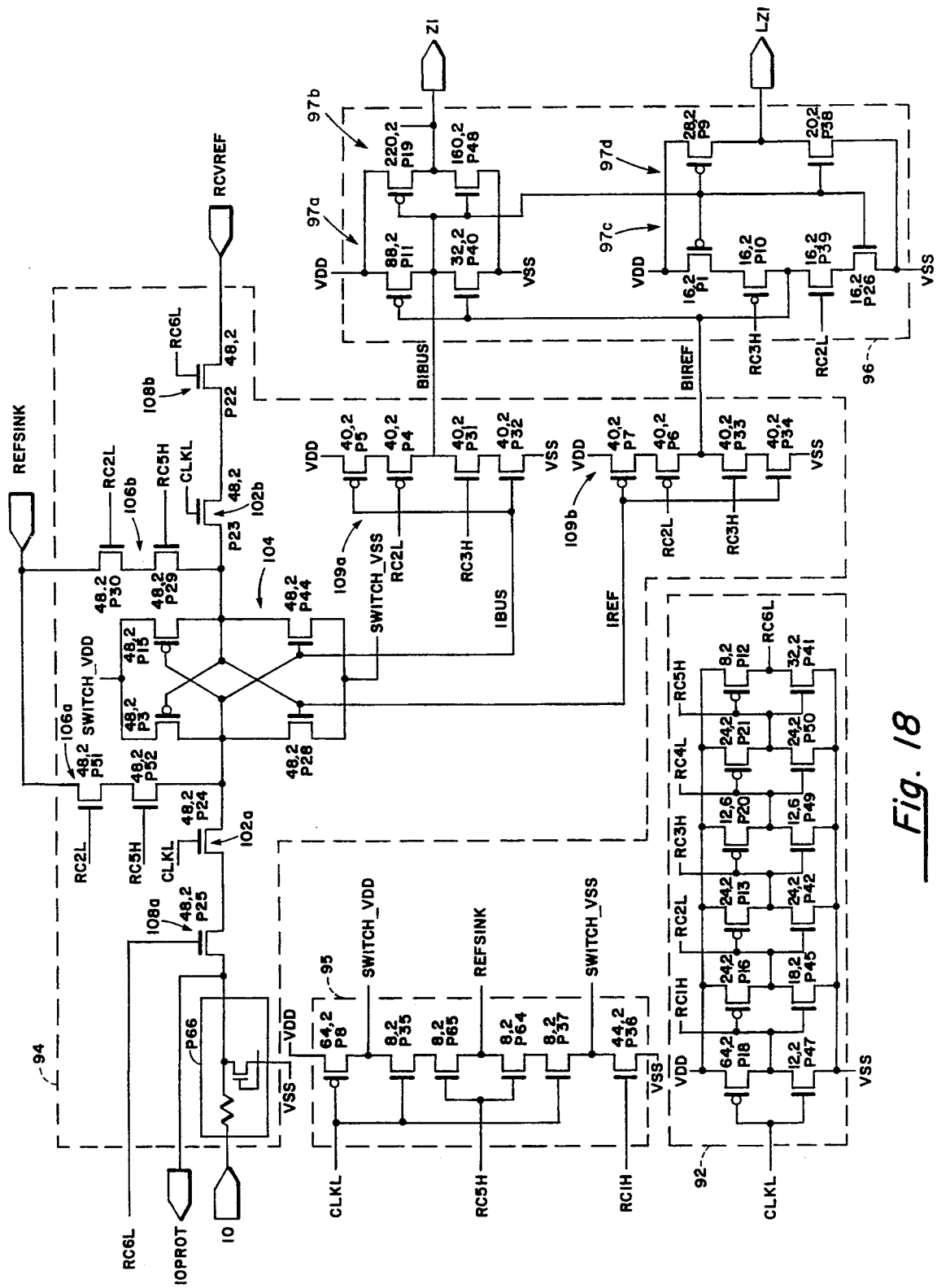
FIG. 18 is an electrical schematic diagram of an embodiment of the receiver of FIG. 16.

In some applications of the receiver 90 it is preferable to bypass the line RCVREF to VDD and VSS with capacitors 111a, 111b, as shown in FIG. 18 provided from preferably PMOS or NMOS transistors having drain and source electrodes coupled together. Other control and reference signals may also benefit from this dual coupling arrangement in order to adequately compensated for common mode type noise on signal lines.

The resolver circuit 104 can be either of several embodiments. In particular, resolver circuit 104 can be a pair of cross coupled inverters as will be further described in conjunction with FIG. 17 or, alternatively, can be a differential amplifier. Other arrangements for resolver circuit 104 may alternatively be used but here the preferred arrangement is that as will be described in conjunction with FIG. 17.

The data resolution circuit 94 further includes precharge circuits 106a and 106b which have an output coupled to line REFSINK and which have an output also coupled to inputs 104a, 104b of resolver circuit 104.

Precharge circuits 106a and 106b are used to precharge the resolver circuit particularly as will be described in conjunction with FIG. 17 to a known charge state prior to latching of new data via input latches 102a, 102b. Thus, the precharge of circuit 104 is used to provide the resolver circuit 104 to a known reference and, furthermore, is used to discharge excess charge provided in the resolver circuit due to a previous received state.

The data resolution circuit 94 further includes isolation latches 108a and 108b which are disposed between corresponding input latches 102a, 102b and respective terminals IO and RCVREF. Isolation latches 108a and 108b are used to provide additional isolation for the data resolution circuit 94 particularly after CLKL transitions to open up latches 102a and 102b, as will be further described below.

The outputs from resolver circuit 104 are fed into output latches 109a and 109b which are used to isolate the outputs of resolver circuit 104 from the remainder of the receiver 90. In particular, output latches 109a and 109b are used to latch data as resolved from resolver circuit 104 and hold said data while a new receiver cycle is initiated in resolver circuit 104.

Figure 17:
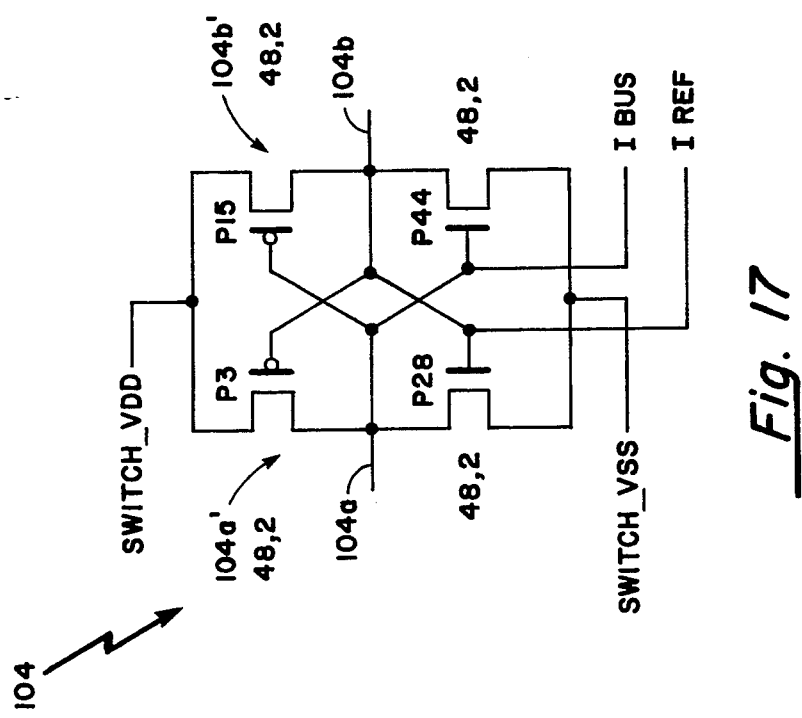
FIG. 17 is an electrical schematic of a resolver circuit used in the data resolution circuit of FIG. 16.

Referring now to FIG. 17, a preferred implementation for resolver circuit 104 is here shown to include a pair of cross coupled inverters 104a' and 104b', as shown. Here inverter 104a' includes a PMOS transistor P3 coupled to an NMOS transistor P28. The drain electrode of PMOS transistor P3 is coupled to the drain electrode of transistor P28 and is also coupled to input 104a. The input 104a is also coupled to gate electrodes of transistors P15 and P44 of the second inverter 104b'. The second inverter 104b' further has the drain electrode of transistor P15 coupled to the drain electrode of transistor P44 and is also coupled to a second input 104b to the resolver 104. Similarly, the input 104b is coupled to the gate electrodes of the transistors P3 and P28 of the first inverter 104a'.

Signals SWTCH_VDD and SWTCH_VSS are also coupled to here respectively a common connection of the source electrodes of transistors P3 and P15 and a common connection of the source electrodes of transistors P28 and P44. Power and reference thus are selectively provided to the resolver circuit 104 in a time sequence which permits the resolver circuit 104 to make a quick determination as to the relative logic state represented by a signals on line 104a relative to a reference on line 104b, as will be described.

Figure 15B:
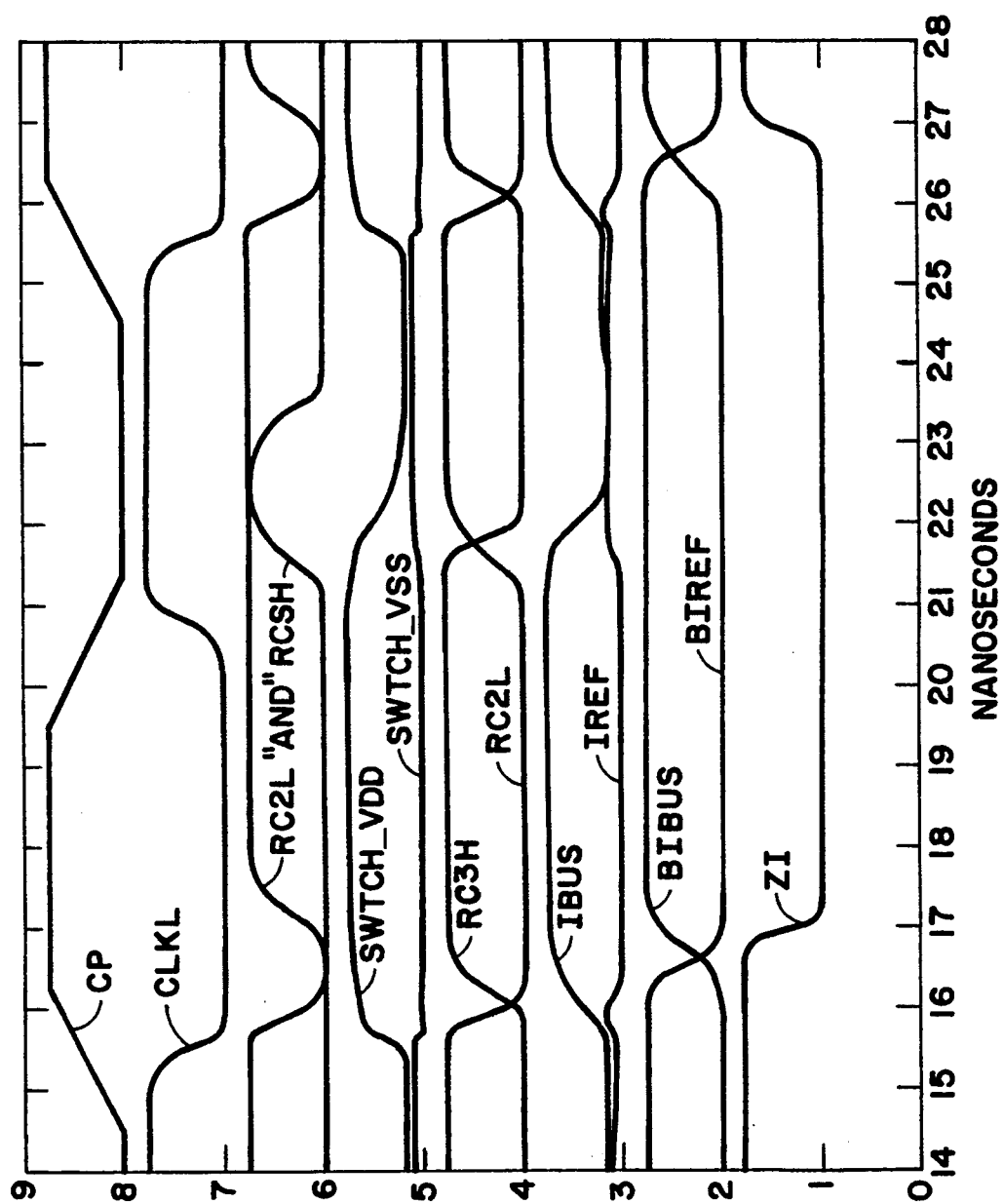

Referring now to FIG. 18, an exemplary illustration of a preferred embodiment of the receiver 90 is shown to include the aforementioned event sequencer circuit 92, data resolution circuit 94, power control circuit 95, and output buffer and latch circuit 96. Here the event sequencer circuit 92 is shown to include a plurality of here six stages of inverters coupled together, as shown, with the outputs of here the second and succeeding ones of said inverters providing the aforementioned clock phase signals RC1H through RC6L, respectively. The size of each of the transistors providing the CMOS inverter arrangements is chosen in order to provide corresponding successively increasing delays with respect to clock signal CLKL. An illustrative example of the successive delays between each of the clock phases is illustrated in conjunction with FIG. 15A, as mentioned above. FIG. 15A will be referred to as necessary to explain further operation of the receiver 90. Moreover, FIG. 15B shows a typical sequence of timing in the receiver 90 for each of the stages of operation of the receiver.

The signals RC1H through RC6L are coupled or fed as necessary to the remaining circuits in the receiver 90. Thus, the data resolution circuit 94 which is shown to include the input latch 102a and 102b here each provided as an NMOS transistor P24 and P23 coupled in a pass transistor configuration between the respective inputs IO, RCVREF. and inputs 104a and 104b to resolver 104. That is the transistors P24 and P23 allow respective signals from lines IO and RCVREF to pass through as long as the control electrode or gates are high. When the gates are low, the transistors are turned off and any charge provided between respective source electrodes and inputs 104a and 104b is isolated from the inputs of the receiver 90. As shown in FIG. 15B, when CLKL is low the transistors P24 and P23 isolate the state in the resolver circuit 94.

The data resolution circuit further has the precharge circuits 106a and 106b here provided as stacks of NMOS transistors P51, P52 and P29 and P30, respectively, having outputs coupled to the inputs 104a and 104b, respectively, of data resolver 104. Also shown as coupled in a pass transistor configuration are transistors P25 and P22 which respectively provide isolation latches 108a and 108b.

The outputs IBUS and IREF from the resolver 104 are fed to output isolation buffers 109a and 109b, respectively, as shown, here provided by a stack of transistors P4, P5, P31 and P32 for latch 109a and a stack of transistors P7, P6, P33 and P34 for latch 109b. The outputs of these output isolation buffers are fed to output latch 96 which is used to latch the relative differential state provided on lines BIBUS and BIREF and to maintain that state after removal of signals from the buffers 109a and 109b.

Power control circuit 95 is also shown to include a stack of series coupled transistors P8, P35, P65, P64, P37 and P36, as shown, and controlled via clock signals CLKL, RC5H and RC1H as also shown. In general, in accordance with the timing sequence provided by the aforementioned clock signals, the switch SWTCH_VDD and SWTCH_VSS signals are sequentially applied to the resolver circuit 104 after the rising CP clock edge.

With particular reference to FIG. 15B, the receiver 90 operates as follows:

A signal is provided from the bus onto bus line 30a to terminal IO as generally mentioned above. When the signal is fed to terminal IO to the receiver 90, latch transistor 102a is in a pass mode; i.e., the clock phase CLKL is high causing the PMOS transistor P24 to conduct the signal through the transistor to the input terminal 104a of resolver 104. Similarly, the pass transistor P25 is also "on" or high since the signal RC6L is also in a high state during this initial period.

Correspondingly, latch transistor 102b and latch transistor 108B are also in a pass mode allowing a voltage corresponding to signal RCVREF to pass through the aforementioned transistors to terminal 104b. Thereafter, when clock signal CP (FIG. 15B) transitions high, i.e., from a logic 0 to a logic 1 state, the data on lines IO is valid and thus intended to be clocked into the receiver 90. Correspondingly, signal CLKL is clocked low causing the transistors P24 and P23, i.e., latches 102a and 102b, to open holding or isolating charge on the inputs 104a and 104b of the resolver 104 and isolating the resolver 104 from the input terminal IO and input terminal RCVREF.

At the initial portion of the receive cycle, nodes SWTCH_VDD and SWTCH_VSS are at an initial state of 0.6 volts as provided from the precharge circuits 95, 106a and 106b during the previous cycle and as will be discussed shortly. Assuming that a logic 1 is clocked in on line IO, then the signal on the input 104a is a voltage corresponding to a voltage level above a predetermined amount above the reference voltage RCVREF.

In the illustrative example, the reference voltage is 0.6+/−0.025 volts. Thus a voltage greater than 0.625 volts is required to differentiate a logic 1 from a logic 0 state and a voltage of less than 0.575 volts is required to differentiate a logic zero state from a logic one state. The band of voltages +/−0.025 volts are the result of circuit and layout capacitance coupling imbalances. Preferably, there is a small amount signal amplitude required for fast data resolution and to avoid resolver metastability.

Thus here when receiving a logic one state the voltage on line 104a is illustratively between 0.625 volts and 1.5 volts. The voltage at the source electrode of transistor P3, as well as the source electrode of transistor P28, is 0.6 volts based upon the precharge condition provided as mentioned above. When the voltage from the data latch 102a and that from latch 102b are each fed to the resolver 104, each of the inverters 104a' and 104b' are preferentially disposed to transition in opposite directions in accordance with the voltage provided at terminals 104a and 104b.

At the source electrode at transistor P3 (coupled to SWTCH_VDD), a voltage of 0.6 volts (rising) is provided, whereas, at the source electrode of transistor P28 (coupled to SWTCH_VSS) a voltage of 0.6 volts (falling) is provided. When CLKL transitions low, the transistor P8 in power control circuit 95 is driven on causing the signal SWTCH_VDD to approach voltage VDD, the supply voltage, as shown in FIG. 15B. Thus the supply voltage is initially coupled to the source of transistor P3 and the source of transistor P15. Correspondingly, transistors P35 and P37 in the power control circuit are driven off. A short time delay thereafter, signal RC1H is asserted causing transistor P36 in power control circuit 95 to transition on coupling signal SWTCH_VSS to VSS or a reference voltage as shown in FIG. 15B.

After this initial sequence, supply voltage SWTCH_VDD and reference voltage SWTCH_VSS are coupled to the resolver 104. In response thereto, the gate electrodes of transistors P3 and P28 are at a reference of 0.6 volts, whereas, the gate electrodes of transistors P15 and P44 are at a voltage corresponding to a logic 1 from the latched data provided from terminal IO (here 0.625 volts up to 1.5 volts). At this point transistor P15 and transistor P44 each have a gate electrode coupled to terminal 104a which is at a high logic level in comparison to the voltage at RCVREF and transistor P3 and transistor P28 each have a gate electrode coupled to terminal 104b which is at RCVREF.

The voltage on line RCVREF causes transistor P3 to turn on which further enforces the logic 1 state at the node 104a and provides a corresponding logic 1 output on signal line IBUS. This value of voltage on the gate of transistor P44 will keep transistor P44 on causing a reinforcement of a logic 0 state on line 104b and output line IREF, thereby reinforcing the state on the gate of transistor P3. Similarly, the voltage on the gate of transistor P15 will be relatively high causing transistor P15 to stay off and the relatively low voltage on transistor P28 will keep transistor P28 off. Thus a logic 1 level will be provided on IBUS and a logic 0 level will be provided on IREF.

A similar arrangement is provided for a logic 0 latched in at node 104a. At this point transistor P15 and transistor P44 each have a gate electrode coupled to terminal 104a which is at a low logic level in comparison to the voltage at RCVREF, and transistor P3 and transistor P28 each have a gate electrode coupled to terminal 104b which is at RCVREF.

The voltage on line 104b causes transistor P3 to turn off which further enforces the logic 0 state at the node 104a and provides a corresponding logic 0 output on signal line IBUS. This value of voltage on the gate of transistor P15 will keep transistor P15 on causing a reinforcement of a logic 1 state on line 104b and output line IREF, thereby reinforcing the state on the gate of transistor P28. Similarly, the voltage on the gate of transistor P44 will be relatively low causing transistor P44 to stay off and the relatively high voltage on transistor P3 will keep transistor P3 off. Thus a logic 0 level will be provided on IBUS and a logic 1 level will be provided on IREF at the transition as indicated in FIG. 15B.

In any event, after the logic state is resolved by the resolver 104, the signals on lines IBUS and IREF are fed to buffers 109a and 109b, respectively. During the period of time when RC2L is low and RC3H is high as shown in FIG. 15B, either transistor P5 or P32 in buffer 109a or transistor P34 or P7 in driver 109b will be turned on to couple the respective logic level to outputs BIBUS and BIREF, respectively.

Signals on BIBUS and BIREF are thus buffered signals provided by output latch buffers 109a and 109b which are interposed to isolate the resolver 104 from the output stage or latch 96 of the receiver 90. These signals are fed into the output latch 96.

The output latch 96 includes a first inverter 97a comprised of transistors P11 and P40, as shown. The signal BIREF is fed to the gate electrodes of transistors P11 and P40 providing an output corresponding to the opposite state from BIREF. This output is likewise coupled to signal BIBUS which reinforces the output of the inverter. With this arrangement, a single inverter stage 97a (transistors P11 and P40) is used to single-endedly latch the differential resolver outputs BIBUS and BIREF, while still maintaining complete symmetry through the data resolver 104 and the data resolution circuit 94.

That is, symmetry is maintained between the receiver node IO and the reference node RCVREF. This symmetry is desirable to insure proper and fast operation of the data resolver 104 by maintaining a charge balance on the pair of nodes 104a and 104b which is upset only by the state of a signal coupled to the node 104a from the terminal IO.

Returning to the output latch 96, the output from inverter 97a is fed through a second inverter stage 97b comprised of transistors P19 and P48 to provide output ZI, a true output corresponding to the value received at terminal IO, as shown in FIG. 15B. Similarly, this output is also fed to a third inverter stage 97c comprised of transistors P1, P10, P39 and P26. This third inverter stage 97c is controlled via transistors P10 and P39 when clock signal RC3H is low and RC2L is high. The gates to transistors P1 and P26 are fed via the output of the first inverter pair P11 and P40 and the drain electrode of transistor P10 is likewise coupled to the gate electrodes P11 and P40. Thus, this switched inverter is used to maintain the logic state of the inverter P11 and P40, hence, inverter P19 and P48 after signals BIBUS and BIREF disappear to enable a device (not shown) coupled to terminal ZI to clock in the state of a signal received at terminal ZI. A fourth inverter stage 97d is provided via transistors P38 and P9 coupled to the first inverter output P11 and P40. This inverter 97d is used to provide an additional high assertion copy (LZI) of the receiver output (ZI) for the speed cell circuit 82 (FIG. 8 and 11). This dedicated signal for the speed circuit is preferred so that the signal is not affected by the loading effects associated with the application specific circuit (ASIC) which receives data from terminal ZI.

Figure 19:
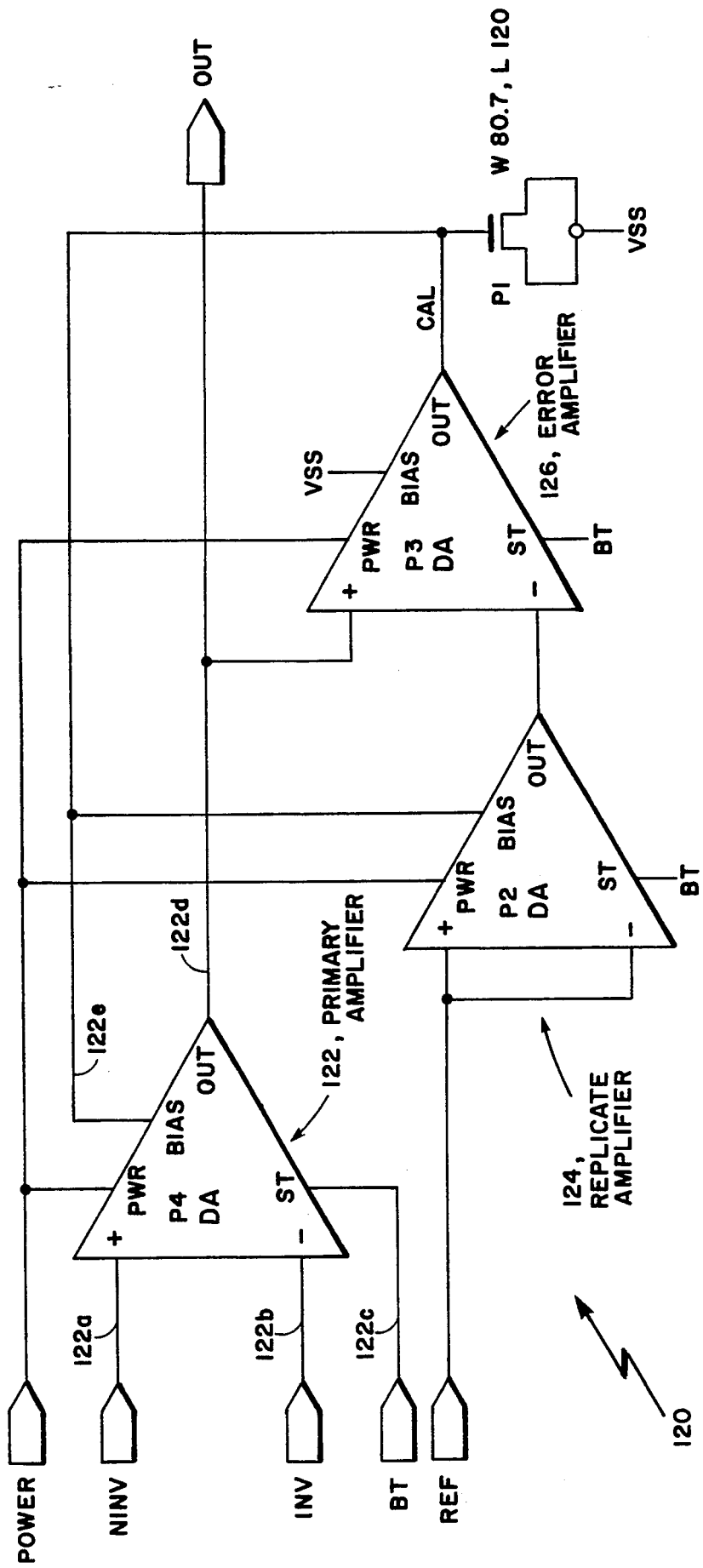
FIG. 19 is a block diagram of a primary-replica amplifier having low offset voltage.

Referring now to FIG. 19, a low offset voltage, high bandwidth operational amplifier 120 suitable for use as the difference amplifier in the control circuit of FIG. 6, 7 and 9C for example is shown to include a first or primary amplifier 122 having non-inverting and inverting terminals 122a, 122b, an enable terminal 122c for testing purposes, output terminal 122d and a bias input terminal 122e. The inputs of the amplifier 122 provide the inverting and non-inverting inputs to the amplifier 120. The amplifier 120 further includes two additional amplifiers 124 and 126 each having like inputs and an output as the aforementioned amplifier 122.

Amplifier 124 acts an a replicate amplifier, and has its inverting and non-inverting inputs fed by a reference voltage REF. The reference input signal is here either the INV or NINV input of amplifier 120. The amplifier 124 produces an output voltage in response to the zero differential input voltage from the connection of the inputs to each other. This output voltage which is the offset voltage of the amplifier 124 and which is comparable in magnitude to that of the amplifier 122 is fed to the inverting input of the error amplifier 126. Coincidentally, the output of amplifier 122 is fed to the non-inverting input of amplifier 126. In response, a signal CAL is provided at the output of the amplifier 126 which is used to adjust the bias on a transistor in amplifiers 122 and 124 to compensate for the offset voltage error in the amplifier 124 and amplifier 122. That is if the offset voltage of the amplifier 124 is relatively high, the signal CAL is correspondingly high biasing the replicate amplifier to produce the same output voltage as the primary amplifier 122. The signal CAL also biases the amplifier 122 at a higher level to thus compensate for the higher offset voltage.

Each of the amplifiers 122, 124, and 126 are preferably identical or at least designed to provide substantially identical offset voltage characteristics. It is thus preferred therefore that the amplifiers are fabricated on the same semiconductor substrate.

Figure 20:
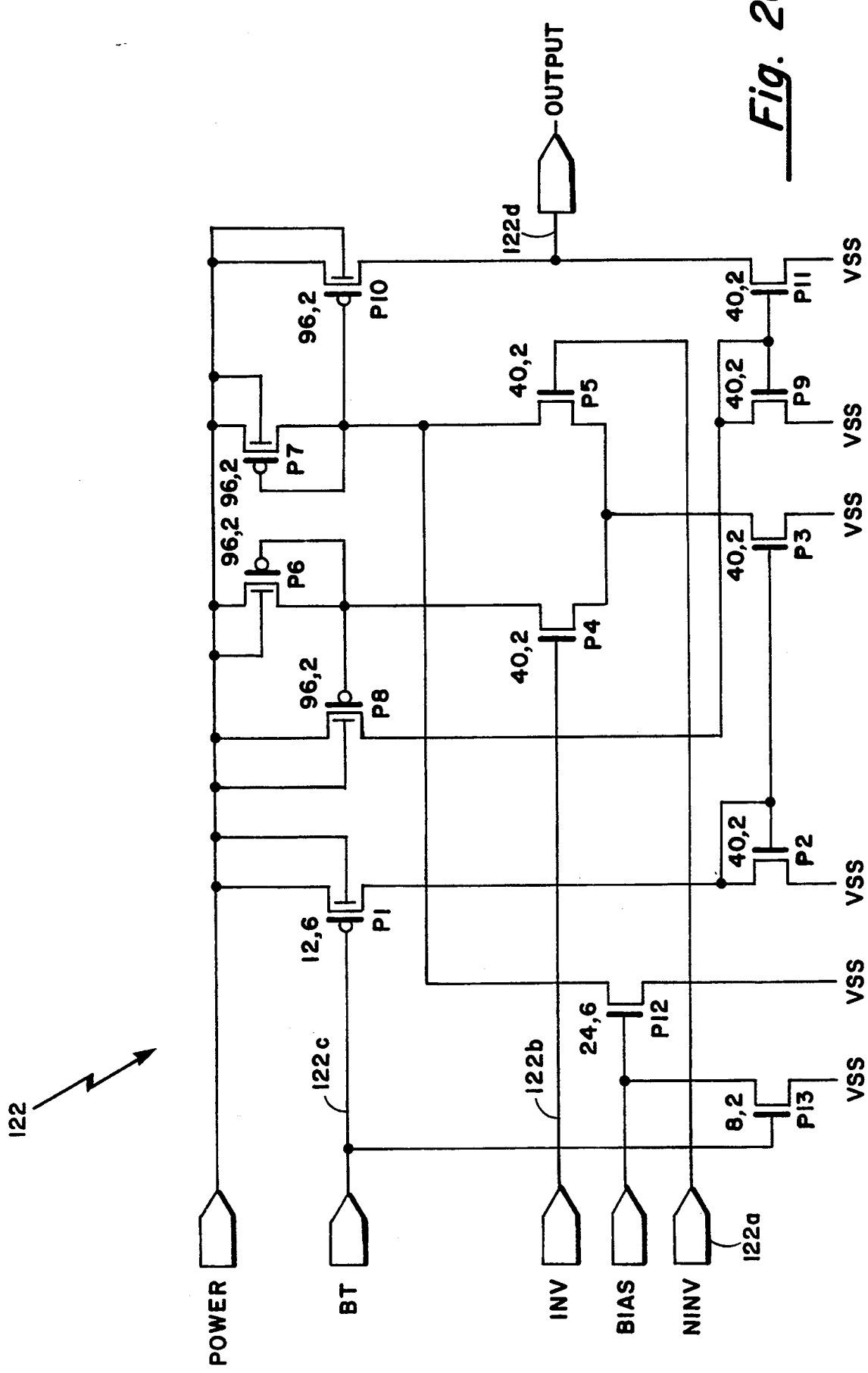
FIG. 20 is a schematic diagram of an operational amplifier used in the amplifier of FIG. 19.

Referring now to FIG. 20, a preferred implementation of each of the amplifiers 122, 124, 126 of FIG. 19 is shown to include a differential amplifier stage 132 having input transistors P4 and P5 each having gates providing respectively, the inverting and non-inverting inputs to the amplifier 122. The transistors P4 and P5 have drain electrodes coupled to respective drain electrodes of PMOS transistors P6 and P7, as shown. The gates of transistors P6 and P7 are likewise coupled to the drains thereof, as shown. With the voltage on the gate of transistor P1 low transistors P1 and P2 generate a current flow and mirror voltage for a transistor P3 which is coupled as a current source for transistors P4 and P5. That is, transistor P3 provides a constant current source for the differential stage 132 and transistors P6 and P7 are here connected as current mirror input structures having gate electrodes coupled to the drain electrode. These transistors P6 and P7 are used to provide gate electrode voltage and hence operating drain current control to P8 and P10.

The amplifier 122 further includes a pair of translation and mirror transistors P8 and P9. Transistor P8 also has its drain electrode coupled to a gate electrode of a transistor P11 having a drain electrode coupled to the output terminal 122d. Transistors P10 and P11 are used to produce mirror currents into or out of output terminal 122d, in response to current changes in the differential amplifier stage 132 and as will be described in response to changes in the level of the signal on terminal BIAS. These mirror currents provided from transistors P11 and P10 into or from the output terminal OUTPUT 122 thus provide the amplifier output current.

The signal on terminal BIAS is fed to a gate electrode of a transistor P12, as shown. The drain of transistor P12 is coupled to a common connection of the drain of transistor P5 the drain of transistor P7 and gate of transistor P10. A current flow through transistor P12 in accordance with the level of the voltage on the gate of transistor P12 produces in response a corresponding current flow through transistor P7. Since the gates of transistors P7 and P10 are tied together, a mirror current flow in accordance with the change in current flow through the transistor P12 is provided through transistor P10 to the output 122d. This compensates for a naturally negative offset voltage characteristic of the amplifier. For a naturally positive offset voltage characteristic, a similar arrangement can be used to change current in transistors P4 and P6 and thus vary current flow through transistor P11.

Having described preferred embodiments of the invention, it will now become apparent to those of skill in the art that other embodiments incorporating its concepts may be provided. It is felt therefore that this invention should not be limited to the disclosed embodiments but rather should be limited only by the spirit and scope of the appended claims.

What is claimed is:

1. A compensated operational amplifier, comprising:
means for amplifying a differential input signal to provide an amplified output signal;
means for replicating a offset voltage characteristic of the means for amplifying;
means, coupled to an output from said amplifying means and an output from said replicating means, for producing a compensation output signal corresponding to a difference in voltage between the output of the replicating means and the output of the amplifying means; and
means, disposed in each of said means for replicating and amplifying, for changing a bias operation point of each of said means in response to said compensation signal to provide said signal from said replicating means equal to said signal from said amplifying means.

2. The amplifier of claim 1 wherein said means for changing said bias operation point of said amplifying means comprises:

means, responsive to input signals in said amplifying means, for producing a mirror current at an output of said amplifier means; and means responsive to said compensation signal for changing the mirror current.

3. The compensated operational amplifier of claim 2 wherein said means for amplifying a differential input signal has an inverting input terminal and a non-inverting input terminal and said replicating means has an inverting input terminal and non-inverting input terminal with said inverting and non-inverting input terminals of said replicating means being connected to a first one of the inverting and non-inverting terminals of said means for amplifying.

4. The compensated operational amplifier of claim 1 wherein each of said means are identical differential amplifiers.

5. The compensated operational amplifier of claim 4 wherein each of said identical amplifiers comprises:
   a pair of transistors disposed to provide a differential input stage to said amplifier;
   a transistor disposed to provide a current source for said pair of differential input stage amplifiers; and
   means for producing a pair of mirror current signals in response to a pair of input signals fed to said pair of differential amplifiers; and
   means responsive to a control signal for changing current flow through one on the transistors in said pair of differential input transistors.

6. The compensated operational amplifier of claim 1 wherein said means for amplifying a differential input signal and said means for replicating an offset voltage characteristic, and said means for producing a compensation output signal each comprise:
   first and second transistors, each having gate electrodes disposed to provide respectively inverting and non-inverting terminals of the respective means;
   a constant current source coupled to sources of said first and second transistors in each of said respective means;
   third and fourth transistors coupled to drains of said first and second transistors in each of said respective means, each of said third and fourth transistors coupled as current mirrors to provide a mirror current flow in a respective one of said first and second transistors in response to a change in current flow in a second one of said first and second transistors;
   fifth and sixth transistors having gates coupled to drains of said first and second transistors in each of said respective means and disposed to provide respective drain current in response to current flows in said third and fourth transistors;
   a seventh transistor having a drain electrode coupled to an output of said amplifier and a gate electrode; and
   an eighth transistor coupled as a current mirror having a gate electrode coupled to gate electrode of said seventh transistor and disposed to provide a mirror current in response to current flow through said sixth transistor to remove current from the output terminal of the amplifier.

7. An amplifier comprising:
   means for providing a differential input stage comprising;
   first and second transistors, each having gate electrodes disposed to provide respectively inverting and non-inverting terminals of the means for providing a differential input stage;
   a constant current source coupled to sources of said first and second transistors;
   third and fourth transistors coupled to drains of said first and second transistors, each of said third and fourth transistors coupled as current mirrors to provide a mirror current flow in a respective one of said first and second transistors in response to a change in current flow in a second one of said first and second transistors;
   fifth and sixth transistors having gates coupled to drains of said first and second transistors and disposed to provide respective drain current in response to current flows in said third and fourth transistors;
   a seventh transistor having a drain electrode coupled to an output of said amplifier and a gate electrode; and
   an eighth transistor coupled as a current mirror having a gate electrode coupled to gate electrode of said seventh transistor and disposed to provide a mirror current in response to current flow through said sixth transistor to remove current from the output terminal of the amplifier.

8. A compensated amplifier comprising:
   a signal amplifier stage having an inverting and non-inverting input and an output and a control input for receiving a bias control signal;
   an offset voltage replicating amplifier having an inverting and non-inverting input and an output and a control terminal for receiving a bias control signal, with the inverting and non-inverting inputs of said offset voltage replicating amplifier coupled to a respective first one of said inverting and non-inverting input of said signal amplifier;
   an error amplifier having inverting and non-inverting inputs and an output with the output of said offset voltage replicating amplifier coupled to the inverting input of said error amplifier, the output of said signal amplifier coupled to the non-inverting of said error amplifier, and the output from the error amplifier coupled to the respective bias inputs of each of the first signal amplifier and offset voltage replicating amplifier with the output of said signal amplifier providing the output for the compensated amplifier.

9. The compensated operational amplifier as in claim 8 wherein the signal amplifier, said error amplifier, and offset voltage replicating amplifier are substantially identical.

10. The compensated operational amplifier of claim 9 wherein each of said amplifiers includes:
   a differential input stage comprised of a pair of transistors each having gate electrodes coupled to respective inverting and non-inverting inputs of said respective amplifier; and
   a transistor having a gate electrode coupled to the compensation terminal of said amplifier and a drain electrode coupled to a drain electrode of one of said transistors of said differential stage; and
   a pair of current mirror transistors coupled to respective transistors of said differential stage.

* * * * *